United States Patent
Uchida

(10) Patent No.: US 8,652,670 B2
(45) Date of Patent: Feb. 18, 2014

(54) BATTERY SYSTEM

(75) Inventor: Masataka Uchida, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/818,275

(22) PCT Filed: Oct. 12, 2011

(86) PCT No.: PCT/JP2011/073417
§ 371 (c)(1),
(2), (4) Date: Feb. 21, 2013

(87) PCT Pub. No.: WO2012/050126
PCT Pub. Date: Apr. 19, 2012

(65) Prior Publication Data
US 2013/0149578 A1    Jun. 13, 2013

(30) Foreign Application Priority Data
Oct. 14, 2010 (JP) ................................. 2010-231639

(51) Int. Cl.
*H01M 10/48* (2006.01)
*H01M 6/42* (2006.01)

(52) U.S. Cl.
USPC ................ 429/90; 429/149; 429/151; 429/99

(58) Field of Classification Search
USPC ......... 429/149, 151, 156, 99, 100, 97, 90, 92, 429/159
See application file for complete search history.

(56) References Cited

U.S. PATENT DOCUMENTS

| | | | |
|---|---|---|---|
| 6,075,346 A | 6/2000 | Kikuchi et al. | |
| 2004/0232879 A1 | 11/2004 | Wang et al. | |
| 2007/0212596 A1* | 9/2007 | Nebrigic et al. | 429/61 |
| 2009/0206679 A1* | 8/2009 | King et al. | 307/125 |
| 2010/0289497 A1* | 11/2010 | Lum-Shue-Chan et al. | 324/426 |
| 2011/0155485 A1* | 6/2011 | Tsurumi et al. | 180/65.1 |

FOREIGN PATENT DOCUMENTS

| | | |
|---|---|---|
| CN | 1711661 A | 12/2005 |
| CN | 101667668 A | 3/2010 |
| JP | 08-339829 A | 12/1996 |

(Continued)

OTHER PUBLICATIONS

International Search Report of PCT/JP2011/073417, mailing date of Jan. 24, 2012.

(Continued)

*Primary Examiner* — Raymond Alejandro
(74) *Attorney, Agent, or Firm* — Westerman, Hattori, Daniels & Adrian, LLP

(57) ABSTRACT

What is provided is a battery system (1) including: a battery side control unit (40) which is generates a battery side information signal having battery information of the battery cells (2); a battery accommodation casing (3) which accommodates the battery cells (2) and the battery side control unit (40); a battery side communication unit (34) which transmits the battery side information signal; a controller side communication unit (32, 33) which generates a synthesized battery side information signal; and a controller side control unit (50) which is electrically connected to the controller side communication unit (32, 33) and generates controlling information corresponding to each battery cell inside the battery accommodation casing (3) based on the battery information and the address information included in the synthesized battery side information signal received from the controller side communication unit (34).

5 Claims, 16 Drawing Sheets

(56) References Cited

FOREIGN PATENT DOCUMENTS

| | | | |
|---|---|---|---|
| JP | 2002-272009 A | 9/2002 |
| JP | 2003-032907 A | 1/2003 |
| JP | 2003-142162 A | 5/2003 |
| JP | 2004-015875 A | 1/2004 |
| JP | 2006-506787 A | 2/2006 |
| JP | 2006-324074 A | 11/2006 |
| JP | 2007-037227 A | 2/2007 |
| JP | 2010-061939 A | 3/2010 |

OTHER PUBLICATIONS

Written Opinion of PCT/JP2011/073417, mailing date of Jan. 24, 2012.

Office Action of CN201180004750, mailing date of Oct. 9, 2012.

* cited by examiner

| BATTERY LOCATION (ADDRESS INFORMATION) | BATTERY CELL TESTING RESULT | GMU TESTING RESULT | STATUS TESTING RESULT | BATTERY STATUS INFORMATION | | | | | |
|---|---|---|---|---|---|---|---|---|---|
| | | | | DETECTION TIME: N | | | DETECTION TIME: N+1 | | |
| | | | | CAN TEMPERATURE (°C) | VOLTAGE BETWEEN TERMINALS (V) | CAN ELECTRICAL POTENTIAL (V) | CAN TEMPERATURE (°C) | VOLTAGE BETWEEN TERMINALS (V) | CAN ELECTRICAL POTENTIAL (V) |
| 1-A (00) | 1 | 1 | 1 | O1 | △1 | □1 | O5 | △5 | □5 |
| 1-B (01) | 1 | 1 | 1 | O2 | △2 | □2 | O6 | △6 | □6 |
| 2-A (10) | 1 | 1 | 1 | O3 | △3 | □3 | O3 | △7 | □7 |
| 2-B (11) | 1 | 1 | 1 | O4 | △4 | □4 | O4 | △8 | □8 |

FIG. 12

PERMISSIBLE PARAMETER VALUE INFORMATION $\swarrow T2$

| PARAMETER VALUE | PERMISSIBLE PARAMETER VALUE |
|---|---|
| CAN TEMPERATURE Tb (°C) | Tbc |
| VOLTAGE BETWEEN TERMINALS Vt (V) | Vtc |
| CAN ELECTRICAL POTENTIAL Vb (V) | Vbc |

BATTERY SYSTEM

TECHNICAL FIELD

The present invention relates to a battery system that is configured by the combination of a plurality of battery cells.

Priority is claimed on Japanese Patent Application No. 2010-231639, filed on Oct. 14, 2010, the content of which is incorporated herein by reference.

BACKGROUND ART

In general, a unit cell (synonymous to the battery cell described later) such as a lithium ion secondary battery is used in a battery system in the form of the combination of a plurality of unit cells. The battery system includes, for example, a plurality of groups (hereinafter, this group will be referred to as a "battery module") that includes a cell group having a plurality of unit cells and a plurality of charging detector CMUs monitoring the cell groups and an assembled battery controller BCU (synonymous to the BMU described later) that controls the plurality of battery modules (for example, see PTL 1). The BCU is connected to the plurality of CMUs respectively installed in the battery modules through an interconnection which is used to transmit and receive data therethrough. Then, each CMU measures a value such as a voltage or a current of the corresponding battery cell, and transmits information on the unit cell corresponding to the measurement result to the BCU through the interconnection. Further, the BCU calculates the state of charge (SOC) and the like of each unit cell based on the information of each unit cell received from each CMU, and determines whether the abnormality occurs by detecting the status of each unit cell.

RELATED ART LITERATURE

Patent Literature

Patent Literature 1: Japanese Unexamined Patent Application, First Publication No. 2003-32907

DISCLOSURE OF INVENTION

Problems to be Solved

However, according to the technique disclosed in Patent Literature (PTL) 1, when the battery system is constructed by the combination of the plurality of battery modules, there is a need to prepare an interconnection which electrically connects the BCU and each CMU to each other inside a casing that accommodates the battery modules. The wiring operation may be an excessively large burden on an operator, and this operation is found to be complicated in many cases.

Even if the wiring operation was efficiently performed, there still remains a possibility that an erroneous wiring operation may be performed by the operator. Such an erroneous wiring operation is critical in the battery system, whereby the battery system may not perform its desired operation.

The invention is made in view of the above-described circumstances, and it is an object of the invention to provide a battery system capable of controlling the unit cells with a minimum burden of the operator and allowing the installation and replacement of the unit cells to be performed easily.

Means for Solving the Problems

An aspect of the present invention is a battery system including: a plurality of battery cells; battery side control units which are respectively provided to the plurality of battery cells and electrically connected to the battery cells to generate a battery side information signal having battery information of the battery cells; a battery accommodation casing which accommodates the plurality of battery cells and at least the battery side control unit; battery side communication units, which are respectively provided to the battery side control units and transmit the battery side information signal; controller side communication units, which are installed to the battery accommodation casing, provided respectively to the battery side communication units, and add address information to the battery side information signal received from the battery side communication units to generate a synthesized battery side information signal; and controller side control units, which are electrically connected to the controller side communication units and generate controlling information corresponding to each battery cell inside the battery accommodation casing based on the battery information and the address information included in the synthesized battery side information signal received from the controller side communication units.

According to this configuration, the battery side information signal is transmitted from the battery side communication units, which is provided respectively to the battery side control units, in a state where the multiple battery cells are placed inside the battery accommodation casing. Then, the battery side information signal is received by the controller side communication unit and transmitted to the controller side control unit after addition of the address information. On the other hand, in the controller side control unit, the installation position of the controller side communication unit, which adds the address information, in the battery accommodation casing is specified in advance.

Because of the configuration described above, the controlling information of each battery cell corresponding to the address information can be generated in the controller control unit without forcing the operator to perform the cumbersome operations by just accommodating the multiple battery cells in a predetermined arrangement in the battery accommodating casing and activating the controller side control unit, the battery side control unit, the controller side communication unit, and the battery side communication unit.

Advantageous Effects of Invention

For this reason, according to the battery system of the present invention, the battery cells can be controlled with a minimum burden on the operator, and the battery cells can be installed and replaced easily.

BRIEF DESCRIPTION OF DRAWINGS

FIG. 11 is a diagram specifically illustrating a controlling information table which is stored in the BMU.

FIG. 12 is a diagram specifically illustrating a permissible parameter value information table which is stored in the BMU.

BEST MODE FOR CARRYING OUT THE INVENTION

First Embodiment

The first embodiment of the invention will be described with reference to FIGS. 1 to 12. Hereinafter, with reference to FIG. 1, the entire configuration of the battery system 1 will be explained. With reference to FIGS. 2 to 5, the structure characteristics of a battery pack included in a battery system 1 will be explained. With reference to FIGS. 6 to 12, the electric configuration of the battery system 1 and the process flow thereof will be described.

Figure 1:
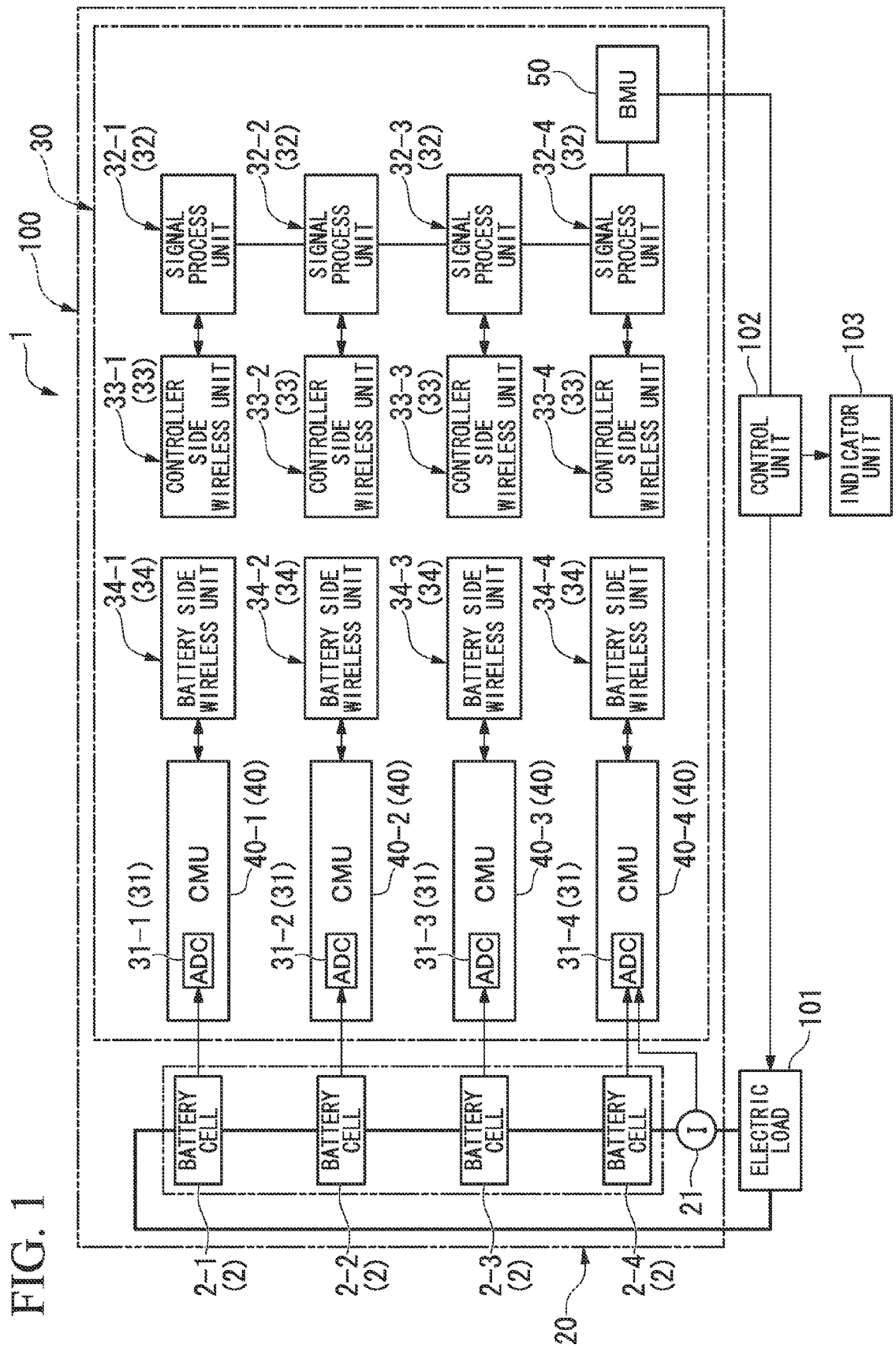
FIG. 1 is a block diagram illustrating a battery system of the first embodiment of the present invention.

As shown in FIG. 1, the battery system 1 of the first embodiment includes an assembled battery 20 which includes battery cells 2, a BMS (Battery Management System) 30 which serves as a control unit monitoring and controlling the assembled battery 20, an electric load 101, a control unit 102, and an indicator unit 103. Among these, the assembled battery 20 and the BMS 30 are accommodated in a battery accommodation casing 3, which is described later, thereby obtaining a battery pack 100.

As the battery system 1, for example, an electric vehicle is exemplified, and hereinafter, the electric vehicle will be described as an example. The battery system 1 may be, for example, a mobile system such as an industrial vehicle like a forklift, a subway, or an airplane or a ship which is obtained by connecting a propeller or a screw to an electric motor as an electric load 101, which is described later, other than the electric vehicle. Alternatively, the battery system may be a stationary system such as a home power storage system or a system interconnection facilitating power storage system combined with the generation of natural energy using a windmill or sunlight. In other words, the battery system 1 collectively refers a system which is driven by using charging and discharging of electric power of the battery cell 2.

The assembled battery 20 is electrically connected to the electric load 101 and the BMS 30, which is described later, and supplies necessary electric power to the electric load 101 under the control of the BMS 30 and the control unit 102. Although it is described that the assembled battery 20 of the embodiment includes four battery cells 2 (2-1, 2-2, 2-3, and 2-4) for the simplicity of description, the number of battery cells 2 constituting the assembled battery 20 differs in accordance with the specification of the electric load 101 which is a charging/discharging subject. For example, when the battery system 1 is the electric vehicle, the number of the battery cells 2 can be approximately several hundred.

The battery cell 2 is, for example, a stacked type lithium ion secondary battery, and positive and negative electrode plates (not shown) are accommodated with a separator interposed therebetween in a battery can (for example, a metallic battery can, and hereinafter, referred to as a "battery can"). Further, each battery cell 2 is provided with a measurement unit which detects a detection value such as a can electrical potential or a can temperature of the battery cell 2 (which will be described later in detail with reference to FIG. 6). Furthermore, the battery cell 2 of the embodiment is not limited to the stacked type, and may be a winding type lithium ion secondary battery. Alternatively, another secondary battery such as a lead storage battery may be adopted.

The BMS 30 includes CMUs (Cell Monitoring Units) 40 which serve as a battery side control unit, a battery side wireless unit 34 which serves as a battery side communication unit, a BMU (Battery Management Unit) 50 which serves as a controller side control unit, and a signal process unit 32 and a controller side wireless unit 33 which serve as a controller side communication unit.

The BMU 50 is connected to the control unit 102 in the battery system 1 through a bus which transmits and receives data therethrough. The BMU 50 calculates associated information related to each battery cell 2 (information related to the parameter value of the battery cell 2, which is described later, and including a SOC (State of Charge) and a SOH (State of Health) of each battery cell 2). Furthermore, the calculation of the associated information is not limited to be executed in the BMU 50, but may be executed by the control unit 102, which is described later.

As shown in FIG. 1, the CMU 40 is provided to each battery cell 2. Hereinafter, when the individual CMU 40 is described, the CMUs will be described as the CMUs 40-1, 40-2, 40-3, and 40-4 by attaching suffix numbers 1 to 4 to the end of the reference numeral corresponding to the battery cells 2-1, 2-2, 2-3, and 2-4. Even in the other configurations, the suffix numbers are attached to the reference numerals when the components correspond to the respective battery cells 2.

Each CMU 40 converts a detection value which is input from the measurement unit into a parameter value as a digital signal by an ADC (Analog Digital Converter) 31, which is described later. Among these, the value of the current which flows to the assembled battery 20 is detected by an ammeter 21 and then is input to the ADC embedded in the CMU 40-4. However, the invention is not limited to this configuration, and the value may be input to any one of the other CMUs 40 (the CMUs 40-1 to 40-3).

In the battery system 1 of the embodiment, a single battery side wireless unit 34 is provided a single CMU 40 which corresponds to the battery side wireless unit 34 in one-to-one relationship. The battery side wireless unit 34 includes a control unit, a wireless transmission unit, and a wireless reception unit which are not shown in the drawings, and a general wireless unit may be applied. Each battery side wireless unit 34 is electrically connected to the corresponding CMU 40.

Further, the BMS 30 includes the controller side wireless unit 33 which corresponds one-to-one to the battery side wireless unit 34. The controller side wireless unit 33 includes a control unit, a wireless transmission unit, and a wireless reception unit which are not shown in the drawings, and a general wireless unit may be applied. Each controller side wireless unit 33 is electrically connected to the signal process unit 32, and transmits a battery side wireless signal Ssc (described later) as a battery side information signal received from the corresponding battery side wireless unit 34 to the signal process unit 32.

The signal process unit 32 is provided installed to correspond one-to-one to the controller side wireless unit 33, and each includes a memory which is not shown in the drawings (for example, a volatile memory or a non-volatile memory including a rewritable region).

The electric load 101 converts the electricity supplied from for example the assembled battery 20 to power. In a case where the battery system 1 is an electric vehicle shown in the present embodiment, an electric motor is an example of the electric load 101.

The control unit 102 is, for example, an ECU (Electronic Control Unit) which is mounted on an electric vehicle, and is assembled to the battery system 1 and controls the discharging of the assembled battery 20 through the BMS 30, thereby driving the electric load 101. The control unit 102 may control the entire electric vehicle, for example, an in-vehicle unit such as a wiper or a car navigation system which is mounted on the electric vehicle in addition to the control of the driving of the electric load 101.

The indicator unit 103 is a unit which visually outputs the associated information of each battery cell 2 or the entire assembled battery 20 or the battery information, which is described later. Example of the indicator unit 103 is an instrument panel installed in an electric vehicle or a monitor of the car navigation system. The indicator unit 103 is connected to the control unit 102 through a bus for receiving data. Then, when the control unit 102 receives an input signal which is input by a driver or the like of the electric vehicle from an input device (not shown), the indicator unit 103 displays the associated information or the like under the control of the control unit 102. The method of outputting the associated information is not limited to this example, and for example, the associated information or the like may be output in terms of a voice through a speaker installed to the electric vehicle.

Next, the structural characteristics of the battery pack 100 of the battery system 1 will be described with reference to FIGS. 2 to 5. For convenience of description, as described in FIGS. 2 to 4, the X, Y, and Z axes perpendicular to each other will be respectively set, and the characteristics of the battery pack 100 will be described by appropriately using these directions.

Figure 2:
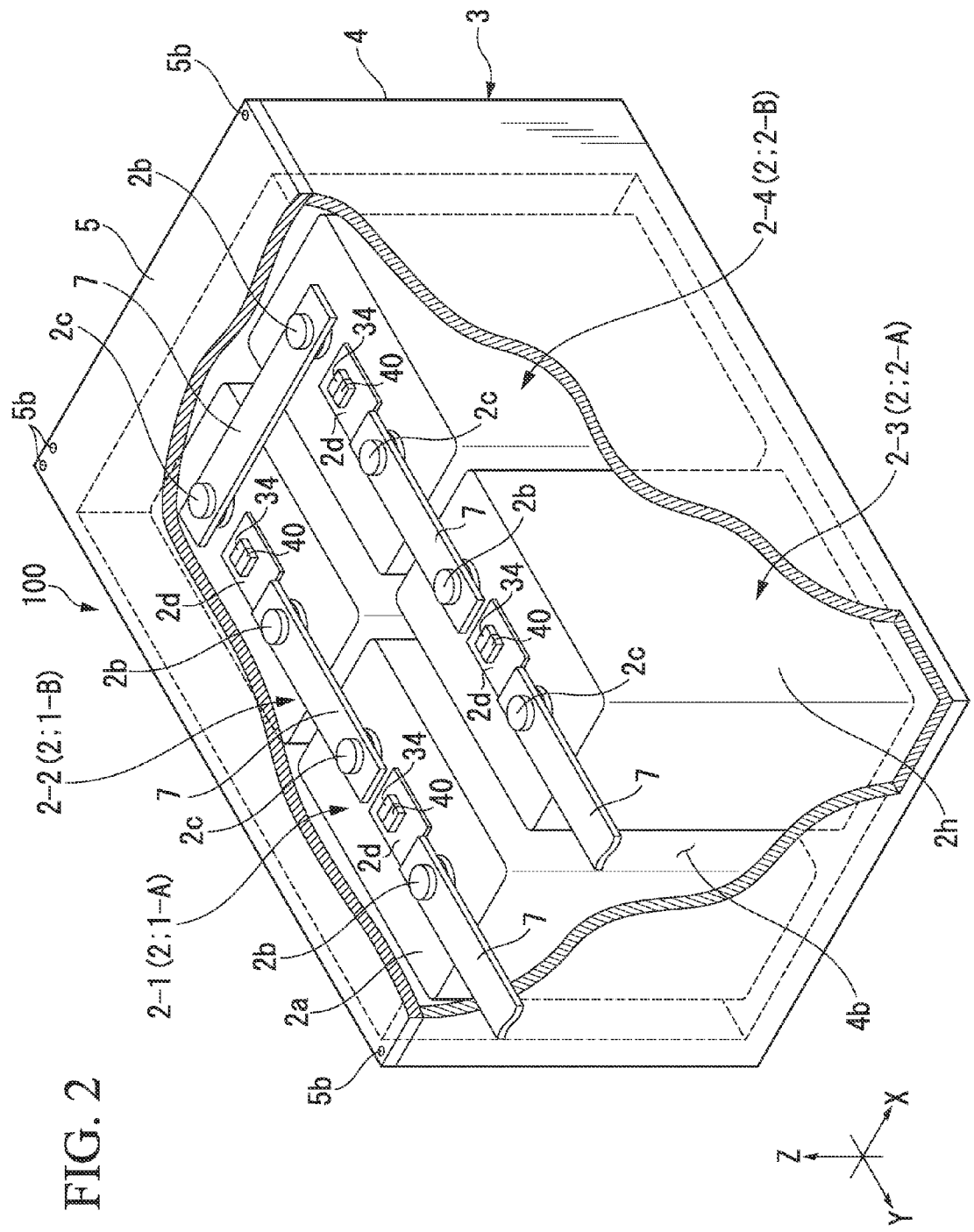
FIG. 2 is a partially cut-away perspective view illustrating a battery pack which is included in the battery system of the first embodiment of the present invention.
Figure 3:
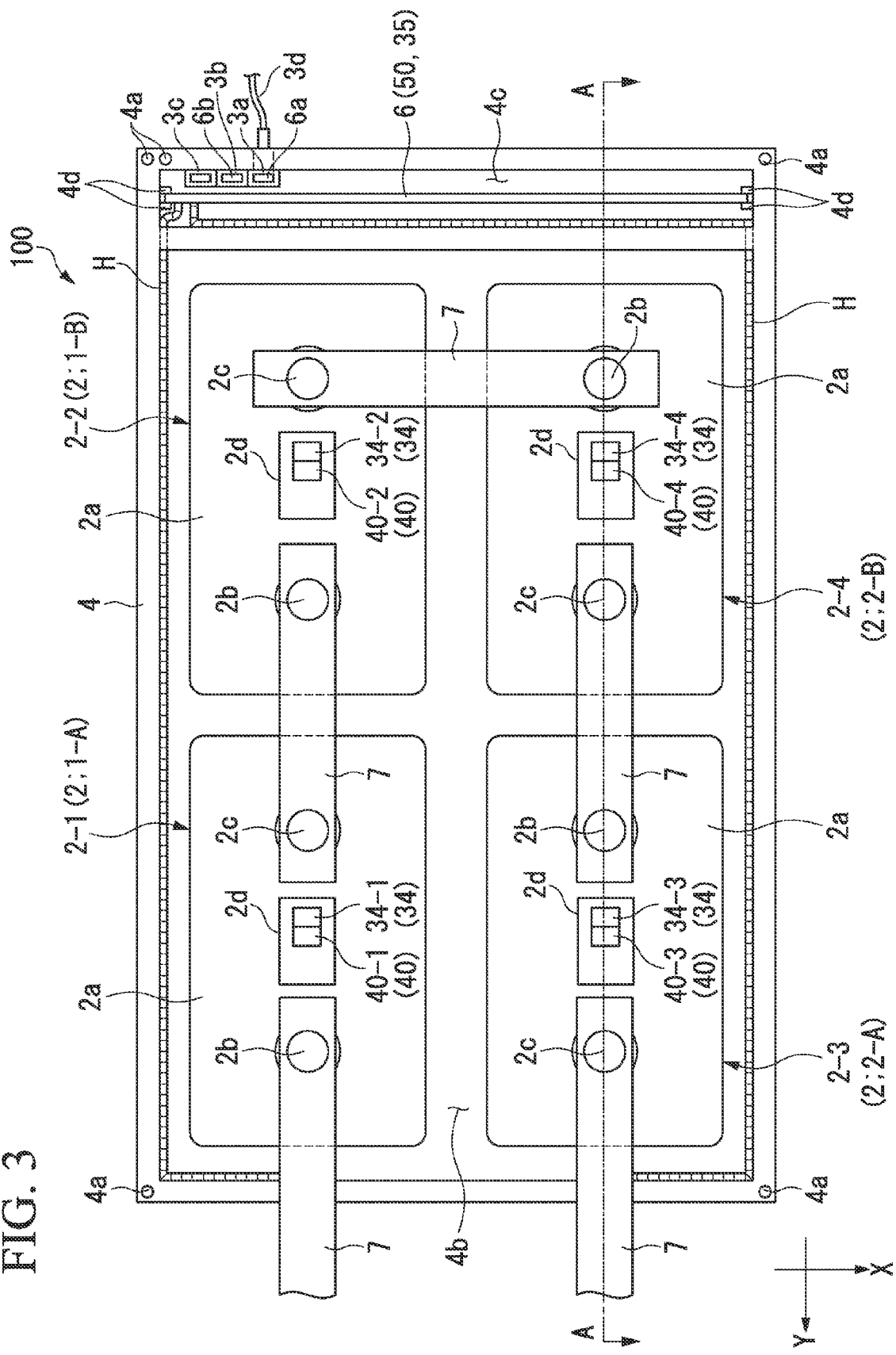
FIG. 3 is a top view illustrating a state where the cover portion of the battery accommodation casing is removed in the battery pack which is included in the battery system of the first embodiment of the present invention. It is a block diagram specifically illustrating the battery side wireless unit and the controller side wireless unit in the battery system of the first embodiment of the present invention.

As shown in FIGS. 2 and 3, the battery pack 100 includes the battery accommodation casing 3 which accommodates the battery cells 2. The battery accommodation casing 3 includes a casing body 4 of which one surface is opened and which is substantially formed in a square shape and a cover portion 5 which closes the opening of the casing body 4. A bolt hole 4a is formed in each of four corners of the opening of the casing body 4. On the other hand, in the cover portion 5, a bolt insertion hole 5a is formed at a position corresponding to the bolt hole 4a of the casing body 4. Then, when a fixing bolt 5b is threaded (screw-connected) into the bolt hole 4a through the bolt insertion hole 5a, the cover portion 5 and the casing body 4 are integrated with each other. In the present embodiment, the number of the bolt holes 4a and the bolt insertion holes 5a formed at one of four corners of the battery accommodation casing 3 is different from those of the other corners. Accordingly, the cover portion 5 can be combined with the casing body 4 always in a constant direction, and the assembly of the cover portion 5 and the casing body 4 can be performed without any error.

The casing body 4 includes a battery accommodation portion 4b which accommodates the battery cells 2 and a control substrate accommodation portion 4c which accommodates a controller side control substrate 6 having the BMU 50 mounted thereon. In the present embodiment, as described above, the battery accommodation portion 4b is formed in a space where four battery cells 2 can be accommodated at accommodation positions of two rows by two columns.

Each battery cell 2 which is accommodated in the battery accommodation portion 4b is substantially formed in a rectangular parallelepiped shape in the present embodiment, and includes an upper surface 2a and a side surface 2h. Among these, a positive electrode terminal 2b and a negative electrode terminal 2c protrude from the upper surface 2a of the battery cell 2, and are electrically connected to the above-described stacked structure having the positive electrode plate and the negative electrode plate. In four arranged battery cells 2, the adjacent battery cells are connected in series to each other so that the positive electrode terminal 2b and the negative electrode terminal 2c are connected to each other by a bus-bar 7. Then, the bus-bar 7 which is connected to the positive electrode terminal 2b of the one-end-side battery cell 2 and the negative electrode terminal 2c of the other-end-side battery cell 2 in the battery cells connected in series to each other may protrude from the battery accommodation casing 3 so as to be connected to the outside.

In the upper surface 2a of each battery cell 2, each battery side control substrate 2d is attached and fixed to a region where it does not overlap a safety valve (not shown).

The CMU 40 and the battery side wireless unit 34 are mounted on the battery side control substrate 2d, and the CMU 40 and the battery side wireless unit 34 are electrically connected to each other through an interconnection (not shown). The battery side control substrate 2d is electrically connected to the corresponding battery cell 2, and the CMU 40 and the battery side wireless unit 34 obtain electric power necessary for driving from the battery cell 2.

Hereinafter, in order to specify the battery locations (accommodation positions) of four arranged battery cells 2 inside the battery accommodation portion 4b, in FIG. 3, the upper side is defined as the first row, and the lower side is defined as the second row. Further, the left side is defined as the A column, and the right side is defined as the B column. Accordingly, with regard to the positions of the battery cells 2, the position of the battery cell 2-1 is referred to as a battery location 1-A, the position of the battery cell 2-2 is referred to as a battery location 1-B, the position of the battery cell 2-3 is referred to as a battery location 2-A, and the position of the battery cell 2-4 is referred to as a battery location 2-B.

Figure 4:
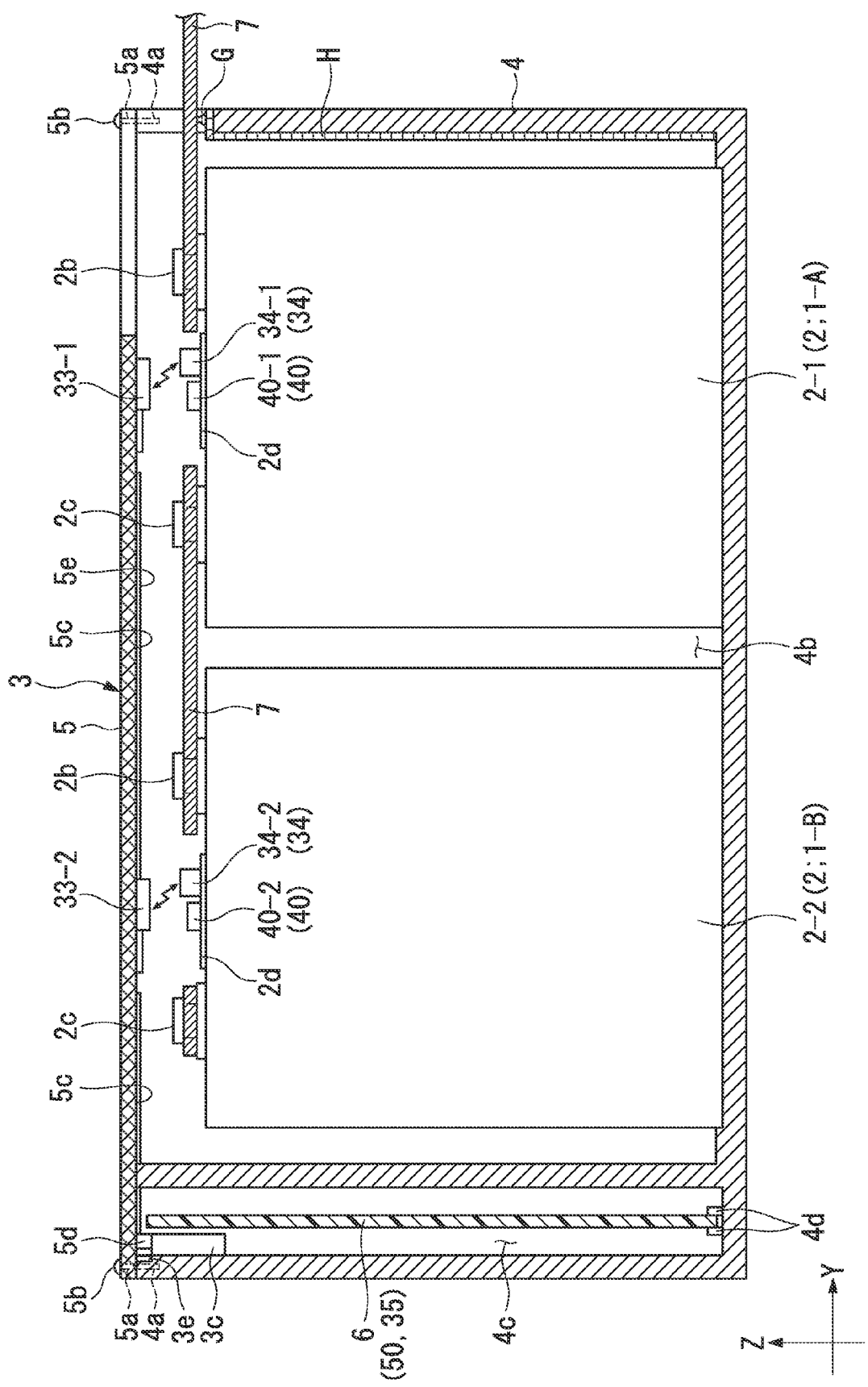
FIG. 4 is a cross-sectional view taken along the cutting line A-A of the battery pack shown in FIG. 3.

As shown in FIGS. 3 and 4, in the casing body 4 of the battery accommodation casing 3, a pair of protrusions 4d and 4d is disposed in the inner surface of the control substrate accommodation portion 4c so as to protrude from the bottom surface of the casing body 4 in the upward direction (the positive side in the Z direction). The controller side control substrate 6 is fixed and held inside the control substrate accommodation portion 4c in a manner such that the edges are inserted between the pair of protrusions 4d and 4d.

The controller side control substrate 6 which is accommodated in the control substrate accommodation portion 4c is connected to the bus-bar 7 through a power feeding line H, and receives electric power necessary for driving from the battery cell 2. Specifically, as shown in FIG. 4, in the casing body 4, a contact terminal G is formed in a protrusion hole through which the bus-bar 7 protrudes outward, and when the bus-bar 7 is fixed to the electrode terminals 2b and 2c, the electric power necessary for the BMU 50 is supplied from the battery cell 2 through the power feeding line H.

The BMU 50 is mounted on the controller side control substrate 6, and the BMU 50 and the controller side wireless unit 33 are electrically connected to each other through a second contact terminal 6b (described later). The controller side wireless unit 33 and the battery side wireless unit 34 are disposed facing each other so as to overlap each other when the cover portion 5 is seen from the Z direction in the top view while being attached to the casing body 4. It is desirable that the battery side wireless unit 34 and the controller side wireless unit 33 communicate with each other by using an electromagnetic wave having directivity (for example, light which is oscillated by a laser diode is desirable, and in the following description, light is an example of a kind of electromagnetic wave). For this reason, when the battery side wireless signal Ssc is transmitted by the corresponding battery side wireless unit 34, the light as the battery side wireless signal Ssc can be received by the controller side wireless unit 33. Alternatively, when a radio shielding member is installed to the battery accommodation casing 3 so as to avoid signal interference with other wireless units, the communication may be performed by using an electric wave without directivity. Further, as long as the communication with the battery side wireless unit 34 is possible, the controller side wireless unit 33 is not limited to the example in which the controller side wireless unit is installed on an inner surface 5c of the cover portion 5 so as to face the controller side wireless unit 33. That is, the "facing" in the embodiment includes the "opposing", and means a state where the controller side wireless unit 33 is disposed so as to correspond to the battery location while enabling the communication between the battery side wireless unit 34 and the controller side wireless unit 33.

The controller side control substrate 6 is provided with two contact terminals, that is, a first contact terminal 6a and a second contact terminal 6b. On the other hand, in the battery accommodation casing 3, the surface of the casing body 4 which faces the controller side control substrate 6 is provided with a first connector 3a to be connected with the first contact terminal 6a, a second connector 3b to be connected with the second contact terminal 6b, and a third connector 3c to be connected with a cover side connection terminal 5d provided in the inner surface 5c of the cover portion 5, which is described later.

The first connector 3a is connected to a connection cable 3d which penetrates the wall of the battery accommodation casing 3 and extends to the outside in a stretched state, whereby the BMU 50 and the control unit 102 of the battery system 1 can communicate with each other through the first contact terminal 6a, the first connector 3a, and the connection cable 3d. The second connector 3b and the third connector 3c are electrically connected to each other, whereby the cover side connection terminal 5d and the BMU 50 connected to the third connector 3c can communicate with each other through the third connector 3c, the second connector 3b, and the second contact terminal 6b.

Further, as shown in FIG. 4, the surface of the casing body 4 which faces the cover portion 5 is provided with a pressure sensor (capacitance type pressure sensor or the like). The pressure sensor has a function of outputting the detection signal Sc of one bit expressed by "0" or "1" in association with the opening and closing of the cover portion 5 (which will be described in detail with reference to FIG. 10). The connection sensor 3e is electrically connected to the BMU 50, and obtains the electric power necessary for driving from the battery cell 2 through the BMU 50.

In the present embodiment, the opening and closing of the cover portion 5 is detected by the pressure sensor. However, instead of the above-mentioned configuration, a configuration may be adopted in which a connection sensor is installed near the third connector 3c and the detection signal Sc is output when the cover side connection terminal 5d and the third connector 3c are connected to and disconnected from each other.

Figure 5:
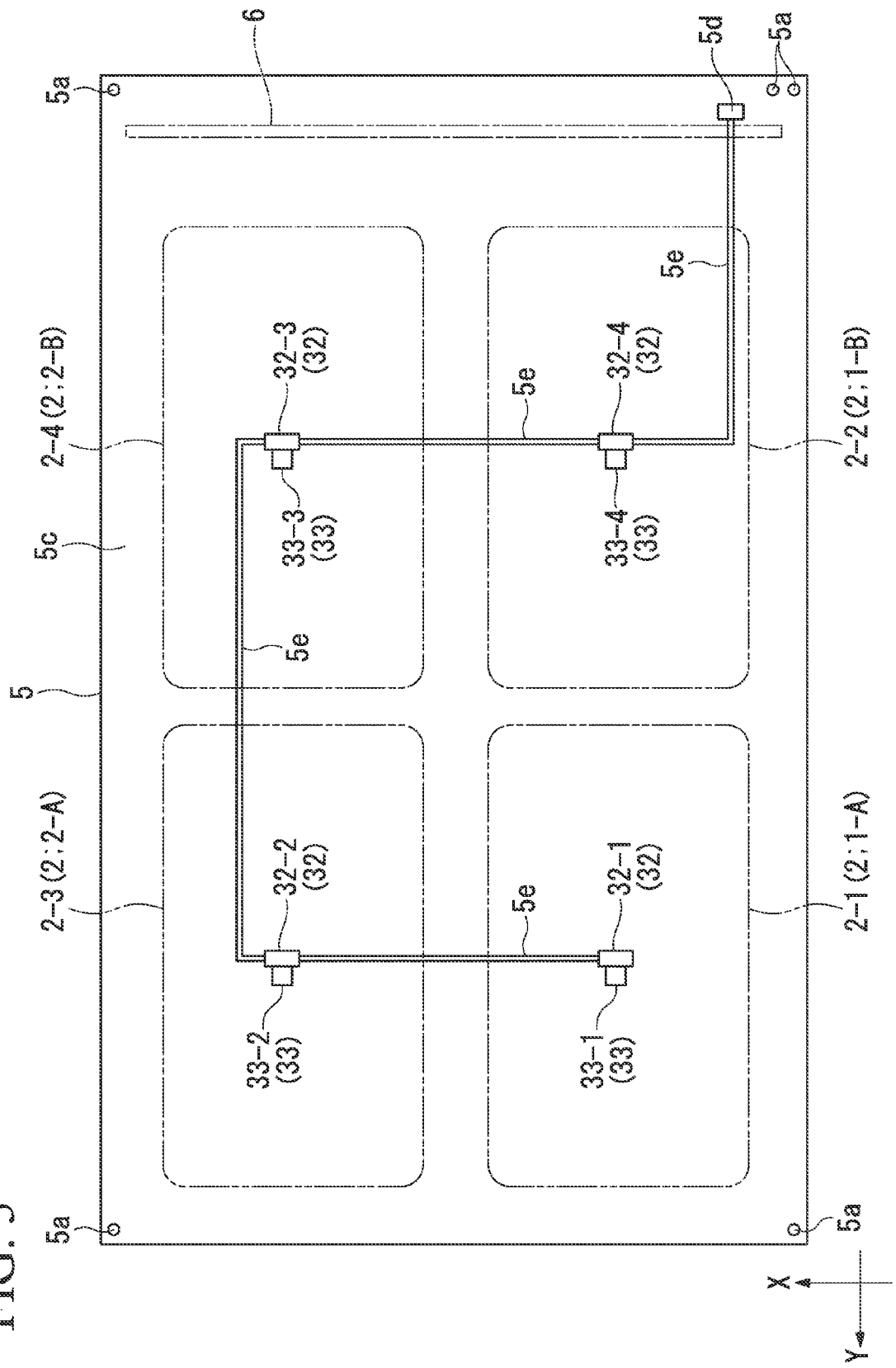
FIG. 5 is a top view illustrating an inner surface of a cover portion of the battery pack which is included in the battery system of the first embodiment of the present invention.

On the other hand, as shown in FIG. 5, in the cover portion 5 of the battery accommodation casing 3, the inner surface 5c which faces the battery accommodation portion 4b and the control substrate accommodation portion 4c is provided with a cover side connection terminal 5d connected to the third connector 3c. Further, the inner surface 5c is provided with the controller side wireless units 33 and the signal process units 32 which correspond to the battery side control substrate 2d of each battery cell 2 (the CMU 40 and the battery side wireless unit 34). The controller side wireless unit 33 and the corresponding signal process unit 32 are electrically connected to each other through a bus (not shown).

The cover side connection terminal 5d is provided at a position corresponding to the third connector 3c, and when the casing body 4 is closed by the cover portion 5, the cover side connection terminal 5d is fitted to the third connector 3c so as to be electrically connected to each other.

The respective signal process units 32 are connected in series to each other by a printed interconnection 5e which is formed on the inner surface 5c of the cover portion 5, and any one signal process unit 32 is electrically connected to the cover side connection terminal 5d by the printed interconnection 5e. Accordingly, a signal can be transmitted and received between the BMU 50 and each signal process unit 32 through the cover side connection terminal 5d and the third connector 3c.

More specifically, in the present embodiment, the signal process units are connected in series to each other in the order of the cover side connection terminal 5d, the signal process unit 32-4 corresponding to the battery cell 2-2 (the battery location 1-B), the signal process unit 32-3 corresponding to the battery cell 2-4 (the battery location 2-B), the signal process unit 32-2 corresponding to the battery cell 2-3 (the battery location 2-A), and the signal process unit 32-1 corresponding to the battery cell 2-1 (the battery location 1-A).

Each signal process unit 32 includes a control unit and a memory which are not shown in the drawings. The memory includes, for example, a rewritable region and a non-rewritable region, and among these, the non-rewritable region stores individual address information. Each signal process unit 32 is fixed to the inner surface 5c of the cover portion 5, and the cover portion 5 is connected to the casing body 4 always in a constant direction, whereby the installation position of each signal process unit 32 always corresponds to a specific battery location.

Then, the control unit of the signal process unit 32 adds the address information to the battery side wireless signal Ssc which is sequentially transmitted from the battery side wireless unit 34 to generate a synthesized battery side wireless signal Ssd. Further, each signal process unit 32 generates reception signals Ab and Ac representing a state where the battery side wireless signal Ssc is received, and transmits the reception signal Ab to the controller side wireless signal reception unit 52 and transmits the reception signal Ac to the battery side wireless unit 34 through the controller side wireless unit 33 (which will be described later with reference to FIGS. 7 and 10). Furthermore, in the present embodiment, since the respective signal process units 32 are connected in series to each other by one bus, the BMU 50 communicates with each signal process unit 32 based on the address information Da.

The address information Da is, for example, digital information of 2 bits, and each address information item Da is correlated to the battery location in advance (which will be understood by appropriately referring to the controlling information table T1 of FIG. 11). For example, in the example shown in FIG. 5, the address information Da of the controller side wireless unit 33-4 is set to "01" so as to correspond to the battery location "1-B", and the address information Da of the controller side wireless unit 33-3 is set to "11" so as to correspond to the battery location "2-B."

In the present embodiment, since the number of the battery cells 2 accommodated in the battery accommodation casing 3 is four, the address information is configured as digital information of 2 bits, but digital information other than 2 bits may be used in accordance with the number of the accommodated battery cells 2.

Next, the process flow of the controlling information controlled by the battery system 1 of the present embodiment and the electric configuration of the BMS 30 will be described with reference to FIGS. 6 to 12.

Figure 6:
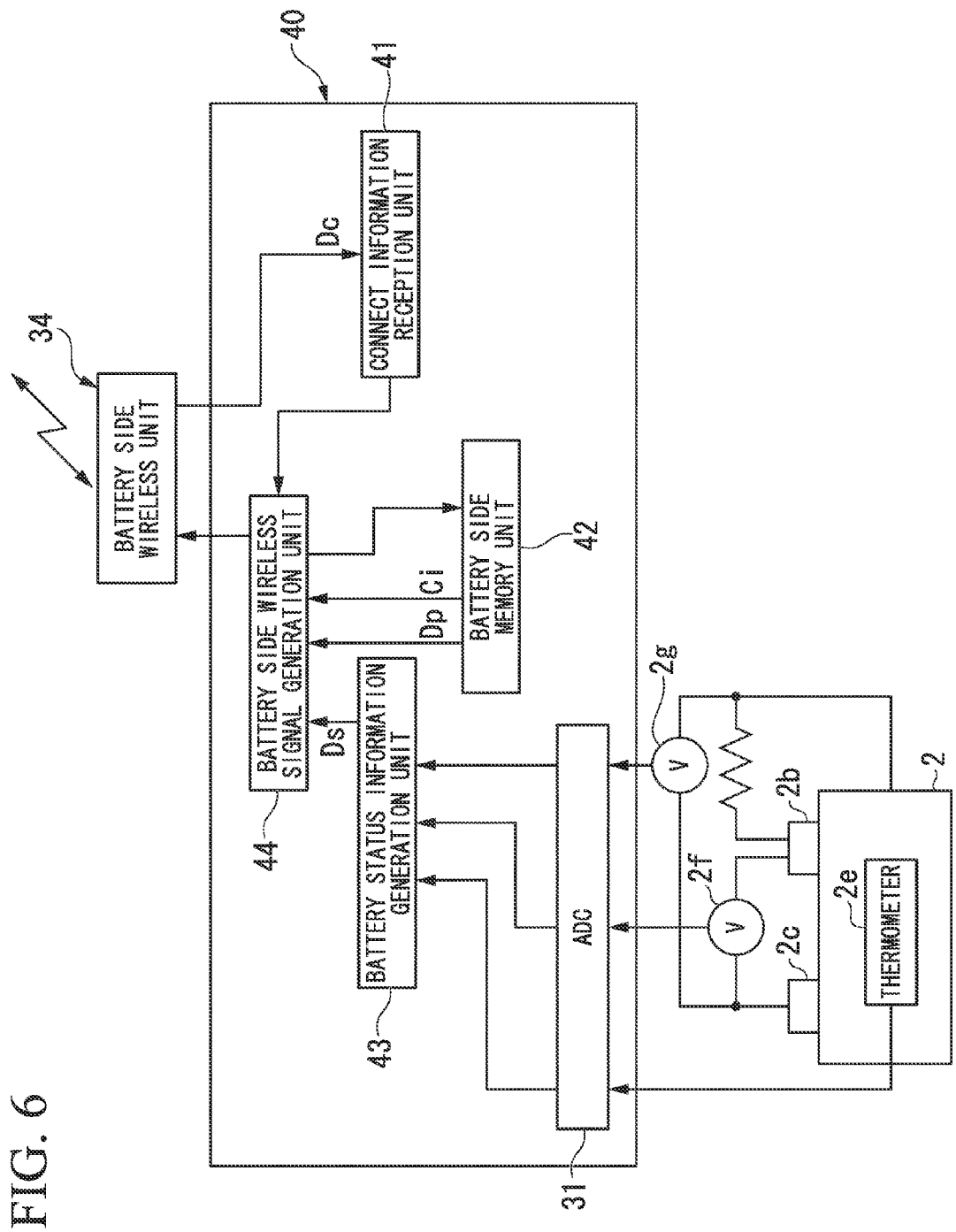
FIG. 6 is a block diagram specifically illustrating the CMU of the battery pack, which is included in the battery system of the first embodiment of the present invention.

FIG. 6 is a diagram specifically illustrating the CMU 40 constituting the BMS 30. The CMU 40 includes an ADC 31, a connect information reception unit 41, a battery side memory unit 42, a battery status information generation unit 43, and a battery side wireless signal generation unit 44.

Figure 7:
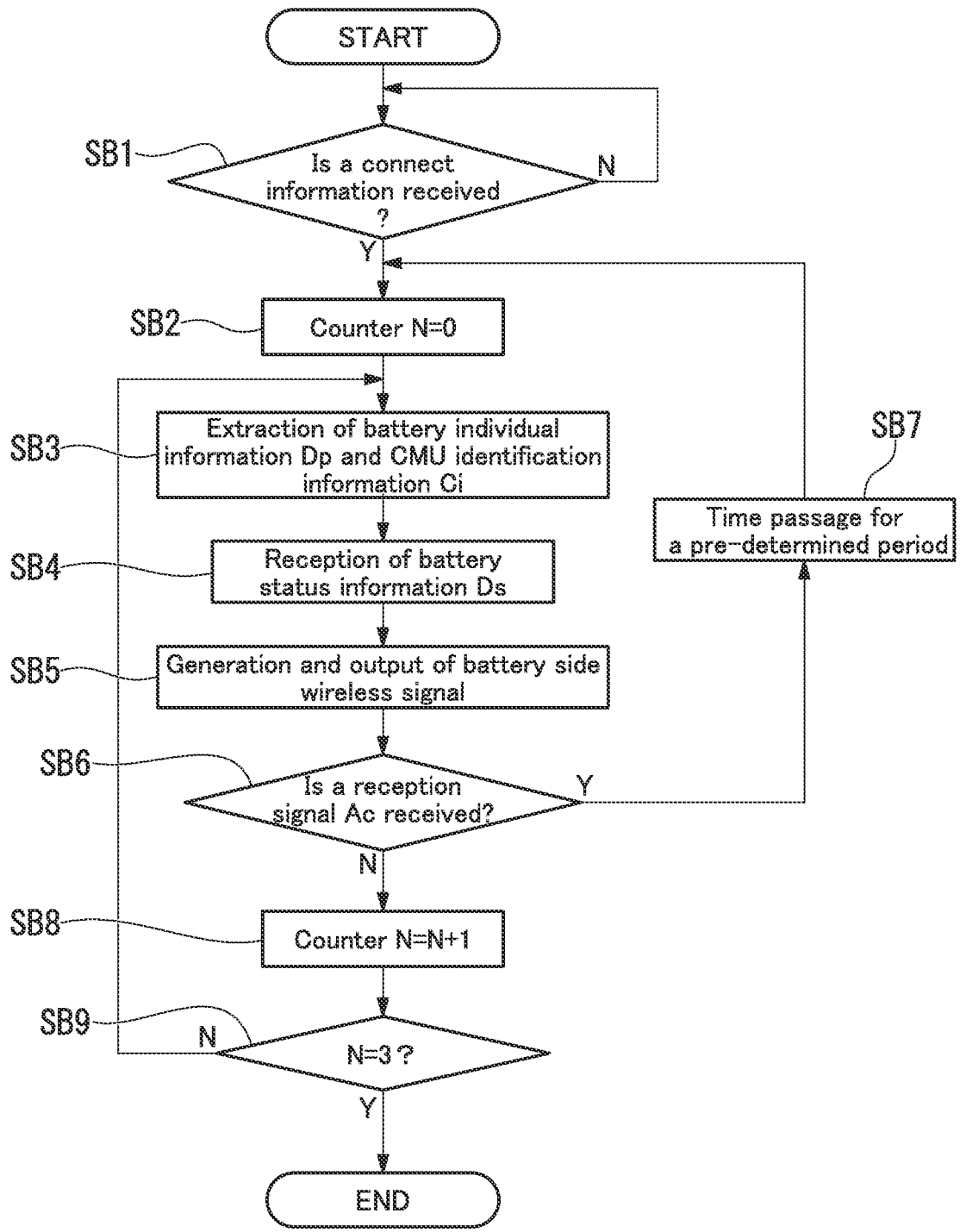
FIG. 7 is a flowchart illustrating a process which is executed in the CMU of the battery system of the first embodiment of the present invention.
Figure 8:
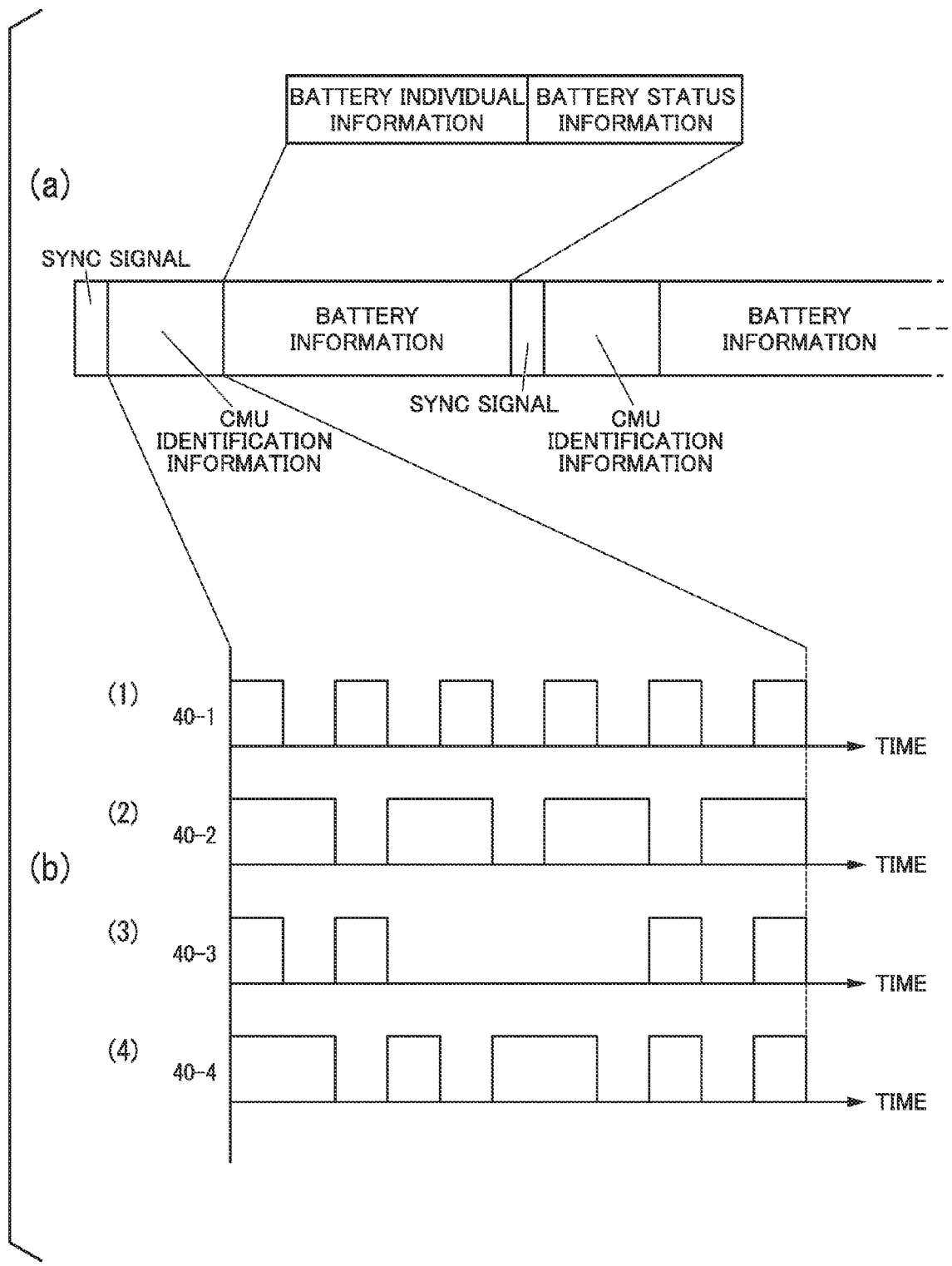
FIG. 8(a) is a diagram illustrating a signal pattern of each CMU identification information item.
FIG. 8(b) is a diagram specifically illustrating a battery side information signal.

The connect information reception unit 41 is electrically connected to the battery side wireless signal generation unit 44 through an internal bus. The connect information reception unit 41 receives connect information Dc (described later) generated by the BMU 50 when the cover portion 5 is assembled to the casing body 4 as shown in FIG. 7 (step SB1). Then, when the connect information Dc is received by the connect information reception unit 41, the connect information reception unit 41 transmits a signal which represents the reception state of the connect information Dc to the battery side wireless signal generation unit 44.

The battery side wireless signal generation unit 44 is also electrically connected to the battery side memory unit 42 and the battery status information generation unit 43 through an internal bus. After the battery side wireless signal generation unit 44 receives the signal from the connect information reception unit 41, the value of the counter N (not shown) provided to the CMU 40 is set to zero ("0") (step SB2).

Subsequently, the battery side wireless signal generation unit 44 extracts battery individual information Dp and CMU identification information Ci stored in the battery side memory unit 42 (step SB3), and receives battery status information Ds from the battery status information generation unit 43 (step SB4).

Then, the battery side wireless signal generation unit 44 generates the battery side wireless signal Ssc based on the battery individual information Dp, the CMU identification information Ci, and the battery status information Ds, and transmits the battery side wireless signal Ssc to the battery side wireless unit 34 (step SB5). In the battery side wireless unit 34, the received battery side wireless signal Ssc is transmitted toward the controller side wireless unit 33.

FIG. 8(b) illustrates an example of the battery side wireless signal Ssc of the present embodiment.

The battery side wireless signal Ssc is a digital signal in which a unit signal having a sync signal, CMU identification information Ci, and battery information is repeated, and has a bit length of 16 bits, for example, as the unit signal. Among these, the sync signal has, for example, an individual value of three bits.

The CMU identification information Ci is identification information (corresponding to, for example, the production number of the CMU 40) which is used to specify the CMU 40 associated with the battery cell 2, has, for example, a bit length of three bits as shown in FIG. 8(a), and is formed as a different individual signal pattern for each CMU 40. The CMU identification information Ci is stored in the battery side memory unit 42, for example, when the CMU 40 is produced.

On the other hand, the battery information is digital data which includes the battery individual information Dp and the battery status information Ds, and has, for example, a bit length of 10 bits. Among these, the battery individual information Dp is digital data (having, for example, a bit length of 5 bits) based on the production number of the battery cell 2 to which the CMU 40 is attached, and is an individual value of each battery cell 2. It is desirable to store the battery individual information Dp in the battery side memory unit 42 by the operator, for example, when the battery side control substrate 2d including the CMU 40 is attached to the battery cell 2.

Further, the battery status information Ds is digital data based on the detection value which is appropriately extracted from the battery cell 2, and has, for example, a bit length of 5 bits. The specific procedure of generating the battery status information Ds is explained below.

As shown in FIG. 6, each battery cell 2 is provided with a thermometer 2e which is able to measure a can temperature, a first voltmeter 2f which is able to measure a voltage between terminals of the positive electrode terminal 2b and the negative electrode terminal 2c, and a second voltmeter 2g which is able to measure a can electric potential as a difference in potential between a reference electric potential (for example, a negative electrode electric potential) and a can. The positive electrode terminal 2b of the battery cell 2 of the present embodiment is connected to a battery can through a desired resistance, whereby the can electrical potential and the potential of the positive electrode terminal 2b become equal to each other.

The detection values from the thermometer 2e, the first voltmeter 2f, and the second voltmeter 2g are respectively input to the ADC 31 of the CMU 40, so that the value is converted from an analog signal (detection value) into a digital signal (parameter value) and is input to the battery status information generation unit 43.

The battery status information generation unit 43 generates the battery status information Ds by synthesizing the temperature data of the thermometer 2e, the data of the voltage between terminals of the first voltmeter 2f, and the can electrical potential data of the second voltmeter 2g as the parameter values with each other, and outputs the battery status information Ds to the battery side wireless signal generation unit 44.

After the battery side wireless signal Ssc is output in step SB5, the battery side wireless signal generation unit 44 determines whether the reception signal Ac (described later with reference to FIG. 10) is generated and output in the signal process unit 32 is received (step SB6). In a case where the reception signal Ac is not received yet, the battery side wireless signal generation unit 44 adds "1" to the value of the counter N (step SB8), and then determines whether the value of the counter after the adding of "1" becomes "3" (step SB9).

Then, when the value of the counter is not "3" (that is, "1" or "2") in step SB9, the process returns to step SB3 and the battery side wireless signal Ssc is generated and output by the battery side wireless signal generation unit 44 again.

On the other hand, when the value of the counter is "3" in step SB9, the battery side wireless signal generation unit 44 stops the generation and the output of the battery side wireless signal Ssc. The reason for this is that there is a high possibility that the reception signal Ac is not received from the signal process unit 32 and any one of components of the BMU 50 including the signal process unit 32 and the controller side wireless unit 33 has a functional problem in this case.

In the present embodiment, the battery side wireless signal generation unit 44 generates and outputs the battery side wireless signal Ssc three times at maximum, but the number is not particularly limited to three times. For example, the determination in step SB9 may be set to a numerical value other than "3."

In a case where the battery side wireless signal generation unit 44 receives the reception signal Ac while generating and outputting the battery side wireless signal Ssc (in step SB6, "Yes"), the process after step SB2 is performed again by the trigger signal generated by the elapse of a predetermined time (step SB7). An example of the "predetermined time" may be, for example, one hour or the like, and when the battery side wireless signal generation unit 44 generates and outputs the battery side wireless signal Ssc after the elapse of the predetermined time, the battery side wireless signal Ssc is periodically transmitted to the BMU 50 after the cover portion 5 is assembled to the casing body 4.

Next, the configuration and the process flow of the BMU 50 serving as the controller side control unit will be specifically described with reference to FIGS. 9 to 12.

Figure 9:
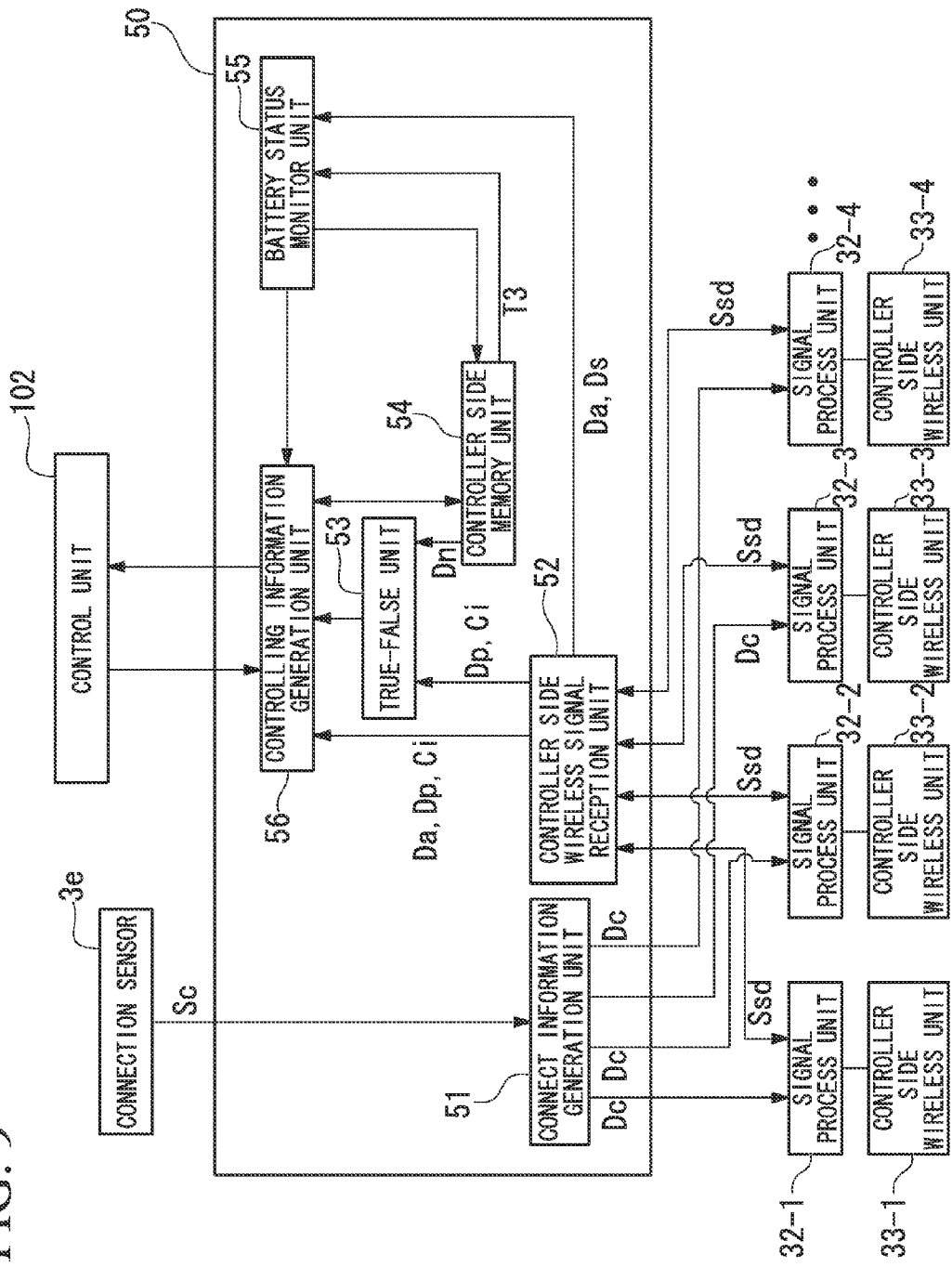
FIG. 9 is a block diagram specifically illustrating a BMU of the battery pack which is included in the battery system of the first embodiment of the present invention.

As shown in FIG. 9, the BMU 50 includes a connect information generation unit 51, a controller side wireless signal reception unit 52, a true-false unit 53, a controller side memory unit 54, and a battery status monitor unit 55.

Figure 10:
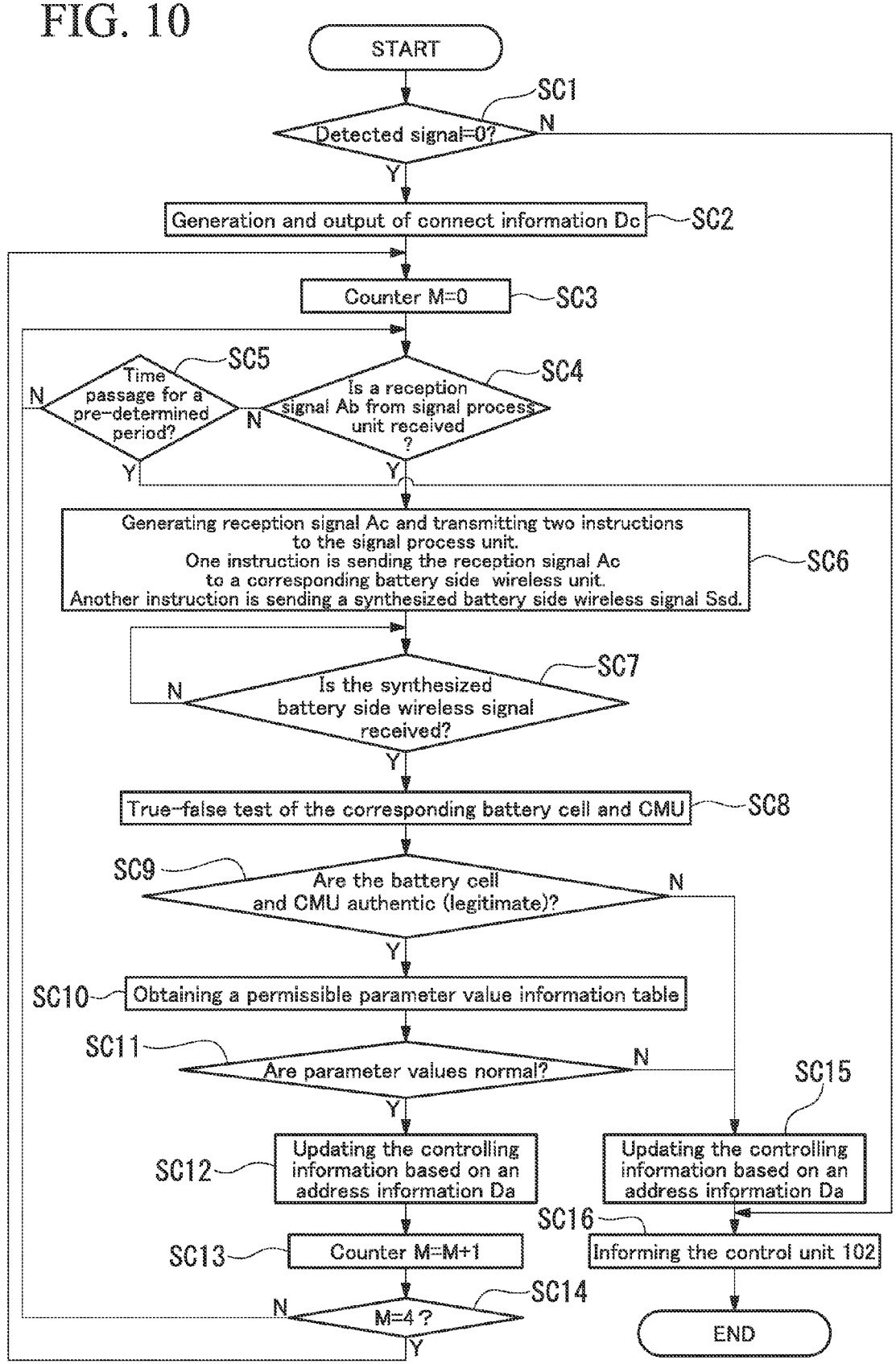
FIG. 10 is a flowchart illustrating a process which is executed in the BMU of the battery system of the first embodiment of the present invention.

The connect information generation unit 51 is electrically connected to the connection sensor 3e and each signal process unit 32. As shown in FIG. 10, when the detection signal Sc output from the connection sensor 3e is received, the connect information generation unit 51 determines whether the received detection signal Sc is "0" (step SC1). As described above, the detection signal Sc is a digital signal which is output from the connection sensor 3e in association with the opening and closing of the cover portion 5, and has, for example, a bit length of 1 bit. The connection sensor 3e of the embodiment is a capacitance type pressure sensor, and for example, when the cover portion 5 is removed from the casing body 4 (that is, the cover portion 5 is opened), the detection signal Sc having a value of "1" is output. On the other hand, when the cover portion 5 is assembled to the casing body 4 (that is, the cover portion 5 is closed), the detection signal Sc having a value of "0" is output.

In a case where the received detection signal Sc is "0", the connect information generation unit 51 generates the connect information Dc, and transmits the connect information Dc to each signal process unit 32 (step SC2).

Then, the BMU 50 sets the value of the counter M, which is held in the BMU 50 but is not shown in the drawings, to "0" (step SC3), and then determines whether the reception signal Ab is received from the signal process unit 32 (step SC4). Here, the reception signal Ab is a signal which represents a state where the signal process unit 32 receives the battery side wireless signal Ssc, is generated by each signal process unit 32 and is transmitted to the controller side wireless signal reception unit 52. Specifically, when the battery side wireless signal Ssc is received by the signal process unit 32, the signal process unit 32 adds the address information Da to the received battery side wireless signal Ssc and stores the result in the embedded memory. Also, the signal process unit adds its address information Da to the reception signal Ab, and transmits the result to the controller side wireless signal reception unit 52.

The controller side wireless signal reception unit 52 receives the reception signal Ab for a predetermined time (step SC5), and when the predetermined time elapses, informs the control unit 102 that the predetermined time has elapsed through the controlling information generation unit 56 (step SC16). This is because there is a high possibility that the signal process unit 32 or the controller side wireless unit 33 or any one of the components of the CMU 40 has a functional problem when the reception signal Ab is not received within the predetermined time, and the abnormality needs to be notified to a user or the like by the control unit 102.

On the other hand, the reception signal Ab is received continuously when the predetermined time does not elapse in step SC5, and the process proceeds to step SC6 when the reception signal Ab is received.

The controller side wireless signal reception unit 52 which receives the reception signal Ab transmits (1) a control signal of generating the reception signal Ac and transmitting it to the corresponding battery side wireless unit 34 and (2) a control signal of transmitting the synthesized battery side wireless signal Ssd generated and maintained by the signal process unit 32 to the controller side wireless signal reception unit 52 to the signal process unit 32 which transmits the reception signal Ab (step SC6).

Then, the controller side wireless signal reception unit 52 waits until the synthesized battery side wireless signal Ssd is received from the signal process unit 32 (step SC7), and when receiving the synthesized battery side wireless signal Ssd, it is determined whether the battery cell 2 and the CMU 40 which correspond to subjects are authentic (step SC8).

The specific process of determining whether the battery cell 2 and the CMU 40 are authentic is performed, for example, as explained below.

The true-false unit 53 of the BMU 50 is electrically connected to the controller side wireless signal reception unit 52 and the controller side memory unit 54 through an internal bus. Then, the battery individual information Dp and the CMU identification information Ci included in the synthesized battery side wireless signal Ssd is received from the controller side wireless signal reception unit 52, and the inquiry data stored in the controller side memory unit 54 is extracted. Then, the true-false unit 53 determines whether the battery cell 2 and the CMU 40 which correspond to subjects are authentic (legitimate) by comparing the inquiry data with the battery individual information Dp and the CMU identification information Ci.

Since the battery cell is newly produced every day, when it is determined whether the production number is an appropriate number as an authentic product using the production number as the inquiry data, there is a need to update the inquiry data which represents the production number corresponding to the battery cell produced newly in the controller side memory unit 54 every time. Furthermore, the "inquiry data" is data which is used to determine whether the battery cell 2 and the CMU 40 are authentic. For example, the production number of the battery cell 2 or the CMU 40 may be used.

Therefore, in the present embodiment, for example, the beginnings or the ends of the production number used in the battery cell 2 or the CMU 40 is made as common symbol and number which verify that it is an authentic product or a code of these (which will be referred to as "authentic product data"), and the inquiry data is generated based on the authentic product data. With such a configuration, the battery cell 2 or the CMU 40 which is newly produced as the authentic product has common authentic product data, and there is no need to update the inquiry data stored in the controller side memory unit 54 every time.

Furthermore, the "authentic product" mentioned in the present embodiment indicates that the battery cell or the CMU is not a counterfeit product, and may also indicate that the battery cell or the CMU does not cause a degradation in performance since the type and the specification of the battery cell or the CMU are the same as those of the other battery cells or CMUs.

Then, when the true-false unit 53 determines that at least one of the battery cell 2 and the CMU 40 as determination subjects is not authentic (legitimate), the true-false unit 53 notifies the battery individual information Dp and the address information Da including the true/false result to the controlling information generation unit 56. On the other hand, the controlling information generation unit 56 which receives the true/false result from the true-false unit 53 reads the controlling information table T1 stored in the controller side memory unit 54, and performs an updating process by inputting the true/false result to the section corresponding to the address information Da (step SC15).

As shown in FIG. 11, the controlling information table T1 includes a battery location column, a battery cell testing result column which indicates the true/false testing result of the battery cell 2, a CMU testing result column which indicates the true/false testing result of the CMU 40, a status testing result column which indicates the status determination result of the battery cell 2, and a battery status information column to which the battery status information Ds is input. Among these, to the testing result column, "1" is input in the authentic and normal status based on the testing result and "0" is input in the inauthentic and abnormal status. Further, to the battery status information column, the respective parameter values included in the battery status information Ds (the can temperature, the voltage between terminals, the can electrical potential, and the like) are input. In the present embodiment, since the battery side wireless signal Ssc is generated every predetermined period, the battery status information column is provided for every detection time (which is based on, for example, the value of the timekeeping counter). Furthermore, the controlling information table T1 may further include a battery individual information column to which the battery individual information Dp is input. In this case, for example, the production number included in the battery individual information Dp is input to the battery individual information column.

Next, the controlling information generation unit 56 notifies an alarm signal, which indicates that the inauthentic battery cell 2 or the inauthentic CMU 40 is assembled to the battery system 1, to the control unit 102 (step SC16).

The control unit 102 of the battery system 1 which receives the alarm signal does not activate the electric load 101, displays a state where the battery cell 2 or the CMU 40 is not an authentic product through the indicator unit 103, and notifies the necessity of replacement of the battery cell 2 or the CMU 40 to the user. Furthermore, when an inauthentic product is attached, the electric load 101 does not need to be inactivated. For example, the electric load 101 may be activated with an output (50% or the like of a rated value) capable of exhibiting a minimum function necessary for ensuring the safety or the activation of the electric load 101 may be stopped after a predetermined period elapses. Further, the state where the attached battery cell 2 or the attached CMU 40 is not an authentic product may be notified through the display using the indicator unit 103 or may be notified through a sound instead of or in addition to the display.

On the other hand, when it is determined that the battery cell 2 and the CMU 40 as determination subjects are authentic (legitimate) in step SC9, the true-false unit 53 transmits a signal which notifies that the battery cell 2 and the CMU 40 are authentic (legitimate) in association with the battery individual information Dp and the CMU identification information Ci to the controlling information generation unit 56. Then, the controlling information generation unit 56 which receives such information transmits an instruction of monitoring the status of the battery to the battery status monitor unit 55.

The status of the battery of the battery system 1 of the present embodiment is performed as explained below. That is, the battery status monitor unit 55 is electrically connected to the controller side wireless signal reception unit 52, the controller side memory unit 54, and the controlling information generation unit 56 through an internal bus, and obtains the address information Da and the battery status information Ds from the controller side wireless signal reception unit 52 and obtains a permissible parameter value information table T2 from the controller side memory unit 54.

As shown in FIG. 12, the permissible parameter value information table T2 includes a parameter value column, which indicates the type of each parameter value, and permissible parameter value columns, which display permissible parameter values corresponding to the threshold values determined as the ranges representing whether the battery cell 2 is normal or abnormal as the parameter values to each of the respective parameter values. In FIG. 12, for the simplicity of description, one threshold value (Tbc, Vtc, and Vbc) is shown as an example of the permissible parameter value. However, it does not have to be a single threshold value, but a predetermined range with upper and lower limits.

Then, the battery status monitor unit 55 determines whether the respective parameter values of the corresponding battery cell 2 are normal or abnormal based on the received battery status information Ds and the received permissible parameter value information table T2 (step SC11). More specifically, the battery status monitor unit 55 compares the permissible parameter value with the respective parameter values constituting the battery status information Ds with reference to the permissible parameter value information table T2 stored in the controller side memory unit 54. Then, the battery status monitor unit 55 determines that it is normal when the parameter value included in the battery status information Ds is smaller than or equal to the permissible parameter value, and determines that it is abnormal when the parameter value included in the battery status information Ds becomes more than the permissible parameter value.

When it is determined that the corresponding battery cell 2 is abnormal as the result of the determination, the battery status monitor unit 55 associates the information representing the determination of abnormality with the address information Da and the battery status information Ds corresponding to the battery cell 2 which is determined to be abnormal, and transmits these information items to the controlling information generation unit 56.

The controlling information generation unit 56, which has received the information indicating that the parameter is abnormal, and the address information Da and the battery status information Ds corresponding to the battery cell 2 determined to be abnormal, reads the controlling information table T1 from the controller side memory unit 54 so as to update the controlling information table T1 (step SC15) and notifies the testing result determined to be abnormal and the position, the battery status, or the like of the battery cell 2 to the control unit 102 (step SC16).

The control unit 102, which has received the testing result determined to be abnormal and the position, the battery status, or the like of the battery cell 2, controls the indicator unit 103 so that the position, the battery status, or the like of the battery cell 2 which is abnormal is displayed. In this case, the control unit 102 may perform the control of limiting the output of the electric load 101 (so as to be, for example, the output of 50%) or the control of halting the operation of the electric load 101 after a predetermined time passes, in addition to the control of displaying the position, the battery status, or the like of the battery cell 2 showing abnormality. The position or the like of the battery cell 2 which is abnormal is not limited to be displayed on the indicator unit 103, and may be informed by a voice through a speaker or the like.

On the other hand, when it is determined that the parameter value of the battery cell 2 is normal by the battery status monitor unit 55 in step SC11, the information indicating that the parameter is normal is associated with the address information Da and the battery status information Ds corresponding to the battery cell 2 determined to be normal, and these information items are transmitted to the controlling information generation unit 56.

The controlling information generation unit 56, which has received the information indicating the parameter is normal in the determination in step SC9 and step SC11 and the address information Da and the battery status information Ds corresponding to the battery cell 2 determined to be normal, reads the controlling information table T1 from the controller side memory unit 54, and updates the controlling information table T1 (step SC12). Specifically, as shown in FIG. 11, the controlling information generation unit 56 inputs "1" as a value which represents a true/false status to the battery cell testing result column of the corresponding battery location (the address information Da), the CMU testing result column, and the status testing result column. Further, the controlling information generation unit 56 inputs respective parameter values (a can temperature, a terminal can voltage, and a can electrical potential) to the battery status information column of the corresponding battery location (the address information Da) based on the battery status information Ds.

Then, the controlling information generation unit 56 updates the controlling information table T1, and adds "1" to the value of the counter M (step SC13).

Next, the controlling information generation unit 56 determines whether the value of the counter M is "4" (step SC 14). When the value of the counter M is not "4", the process returns to step SC4 so as to receive the reception signal Ab from the other signal process unit 32. As described above, in the present embodiment, since four battery cells 2 are accommodated in the battery accommodation casing 3, it is determined whether the value of the counter M is "4" in step SC14. That is, the numerical value which is determined in step SC14 corresponds to the number of the battery cells 2 accommodated in the battery accommodation casing 3, and the numerical value is appropriately changed in accordance with the number of the accommodated battery cells 2.

When the value of the counter M is "4" in step SC 14, that is, the respective values of the controlling information table T1 with respect to all battery cells 2 accommodated in the battery accommodation casing 3 are updated, the process returns to step SC3 so as to set the value of the counter M to zero ("0"), and the process after step SC4 is repeated.

As described above, in the battery system 1 of the present embodiment, the address information Da is added to the battery side wireless signal Ssc by the controller side communication unit (the signal process unit 32 and the controller side wireless unit 33) of which the arrangement position is specified in advance, and the result is transmitted to the BMU 50. Accordingly, it is possible to specify which CMU 40 corresponding to the battery cell 2 disposed at a certain position transmits the battery side wireless signal Ssc transmitted from each battery side communication unit (the battery side wireless unit 34) to the BMU 50.

For this reason, it is possible to correlate the positions of the battery cell 2 and the CMU 40 to the information items of the battery cell 2 and the CMU 40 without forcing the operator to perform the cumbersome operations just by activating the BMU 50, the CMU 40, the battery side wireless unit 34, and the controller side wireless unit 33 while the battery cells 2 are accommodated in the battery accommodation casing 3 according to a predetermined arrangement. Thus, it is possible to perform such appropriate control while specifying the positions of the battery cell 2 and the CMU 40 in the battery accommodation casing 3 with a minimum burden on the operator.

Further, in the battery system 1 of the present embodiment, with regard to the battery information of the battery cell 2, the communication at the CMU 40 and the BMU 50 is wirelessly performed by using an electromagnetic wave. For this reason, it is possible to reduce labors required for the connection of the interconnection for the communication between the CMU 40 and the BMU 50 when installing the battery cell 2 in the battery accommodation casing 3.

Further, in the present embodiment, the individual identification information (the battery individual information Dp and the CMU identification information Ci) in the battery cell 2 and the CMU 40 is transmitted to the BMU 50 while being included in the battery side wireless signal. Thus, the BMU 50 can determine whether the battery cell 2 and the CMU 40 are authentic. When the counterfeit battery cell 2 or the counterfeit CMU 40 is attached, this fact can be notified to the user or the activation of the battery system 1 can be limited. Accordingly, it is possible to obtain the battery system 1 with further improved safety.

Next, other embodiments of the invention will be described with reference to the respective drawings. In the other embodiments described below, the same reference numerals will be given to the components similar to those of the first embodiment or the similar configuration and the description thereof will be appropriately omitted.

Second Embodiment

Figure 13:
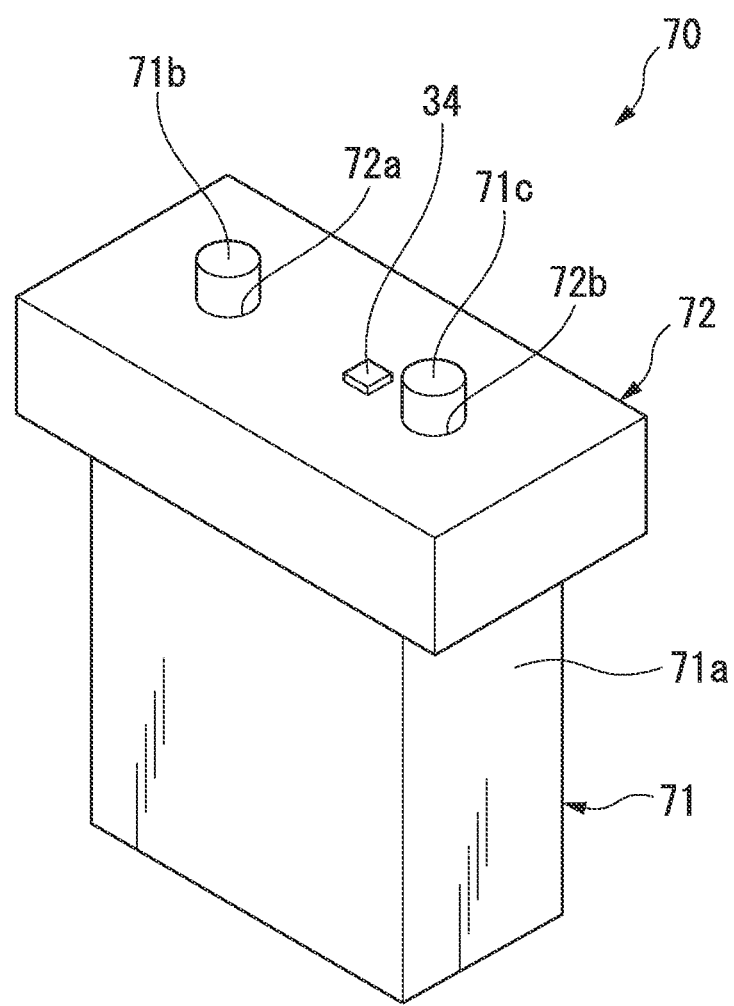
FIG. 13 is a perspective view illustrating a battery cell and a cap which are used in a battery system of the second embodiment of the present invention.
Figure 14:
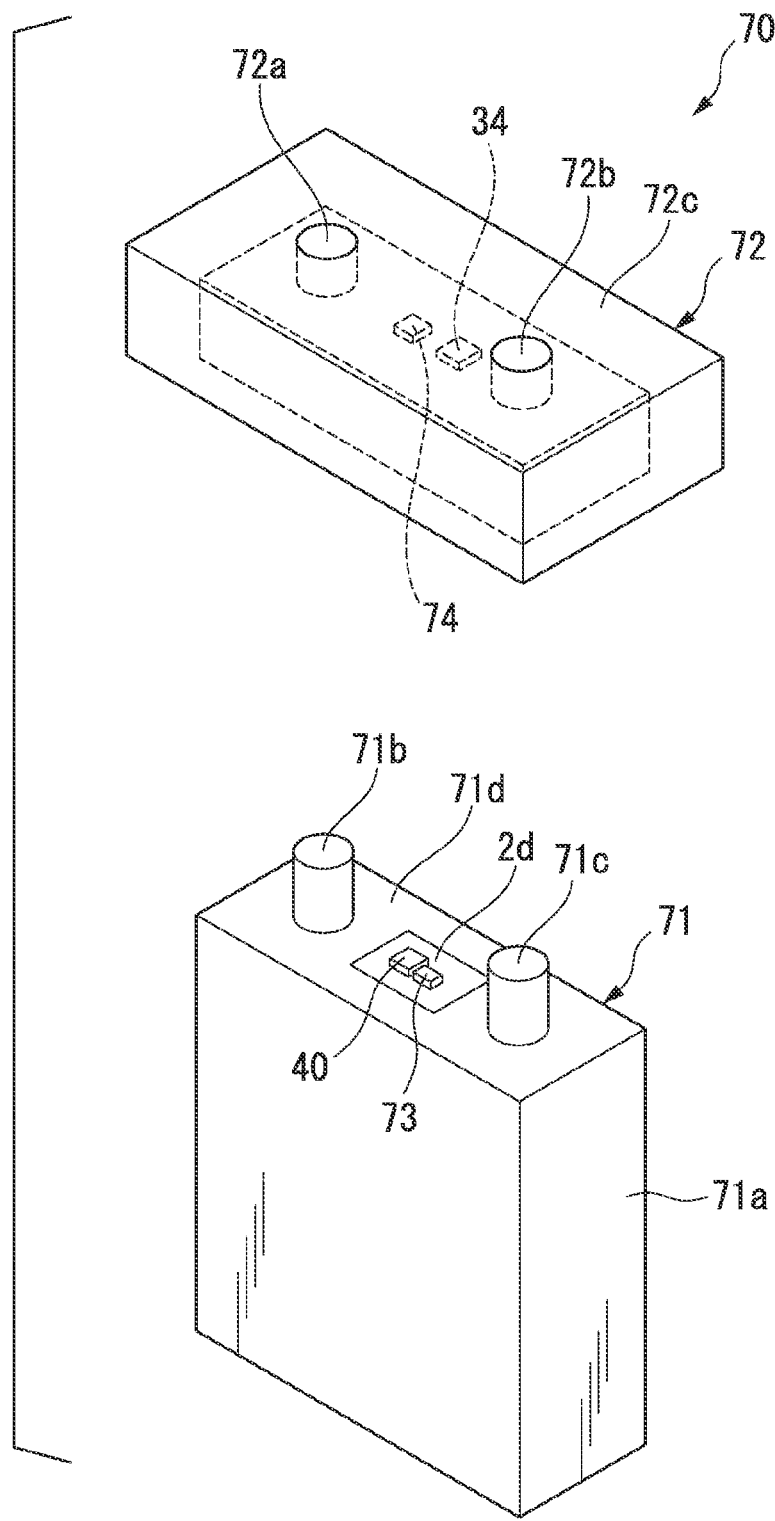
FIG. 14 is an exploded perspective view illustrating the battery cell and the cap which are used in the battery system of the second embodiment of the present invention.

In the first embodiment, the CMU 40 and the battery side wireless unit 34 are mounted on the battery side control substrate 2d installed on the upper surface 2a of the battery cell 2, but the invention is not limited thereto. FIGS. 13 and 14 illustrate a battery cell 70 of a battery system of the second embodiment.

The second embodiment is different from the first embodiment in that each battery cell 70 is provided with a cap 72, a connector 73 which is connected to the cap 72 is installed on the battery side control substrate 2d formed on an upper surface 71d of the battery cell 70, and a connector 74 connected to the connector 73 and the battery side wireless unit 34 are installed to the cap 72, and the other configurations are the same as those of the first embodiment.

The battery cell 70 of the second embodiment includes a battery body 71 which has a stacked structure (not shown) having a battery casing 71a, a positive electrode terminal 71b and a negative electrode terminal 71c installed to the battery casing 71a, and an electrode plate disposed inside the battery casing 71a and a cap 72 which is attachably and detachably installed to the battery body 71. The cap 72 is formed of for example, a resin, and is formed in a substantially rectangular shape so as to match the external shape of the upper surface 71d of the battery cell 70. The cap 72 is fitted to the battery body 71 so as to cover the upper surface 71d provided with the positive electrode terminal 71b and the negative electrode terminal 71c in the battery casing 71a of the battery body 71. The cap 72 is provided with penetration holes 72a and 72b provided at the positions corresponding to the positive electrode terminal 71b and the negative electrode terminal 71c. The positive electrode terminal 2b and the negative electrode terminal 2c in the battery cell 70 protrude from the penetration holes 72a and 72b so as to be connectable to the bus-bar 7. Then, in the embodiment, the CMU 40 is installed in a region where it does not overlap the safety valve (not shown) of the upper surface 71d of the battery body 71, and the battery side wireless unit 34 is installed on the upper surface 72c of the cap 72. The upper surface 71d of the battery body 71 and the lower surface (in the cap 72, the surface facing the upper surface 71d of the battery cell 70) of the cap 72 are provided with the connectors 73 and 74 which correspond to each other. The connector 73 is electrically connected to the CMU 40 through an interconnection (not shown). Further, the connector 74 is electrically connected to the battery side wireless unit 34 through an interconnection (not shown) formed inside the cap 72. The connector 73 and the connector 74 can be electrically connected to each other by fitting the cap 72 to the battery body 71. In this way, when the cap 72 is attached to the battery body 71, the CMU 40 of the battery body 71 and the battery side wireless unit 34 of the cap 72 can communicate with each other by the connectors 73 and 74, and the battery side wireless unit 34 can receive electric power from the battery body 71.

In the second embodiment, the CMU 40 which has a battery cell individual number such as a production number is installed to the battery body 71, and the battery side wireless unit 34 which is also applicable to any battery cell 70 and is widely used is installed to the cap 72. For this reason, even in any case where the battery cell 70 is degraded and the CMU 40 is broken so that it needs to be replaced, the cap 72 and the battery side wireless unit 34 can be re-used even after the battery cell 70 or the CMU 40 is replaced, thereby suppressing an increase in cost with the replacement of the battery cell.

Third Embodiment

Figure 15:
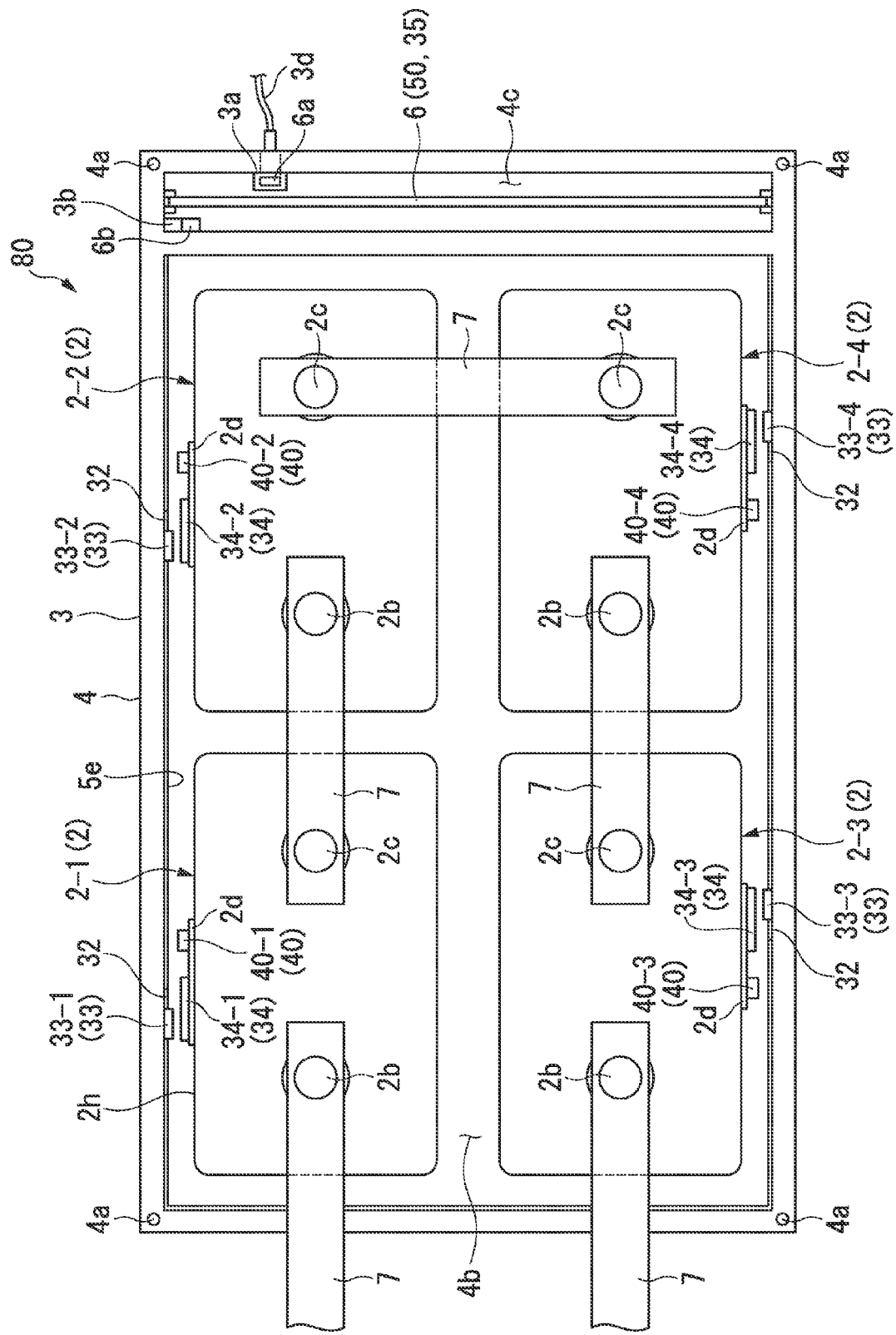
FIG. 15 is a top view illustrating a state where the cover portion of the battery accommodation casing is removed in a battery pack which is included in a battery system of a third embodiment of the present invention.

In the first embodiment, the signal process unit 32 and the controller side wireless unit 33 are installed to the cover portion 5 of the battery accommodation casing 3, but the invention is not limited thereto, and the signal process unit and the controller side wireless unit may be installed to the casing body 4. Hereinafter, the third embodiment of the present invention will be described. FIG. 15 illustrates a battery pack 80 which is included in the battery system 1 of the third embodiment.

The third embodiment is different from the first embodiment in that the battery side control substrate 2d installed to the battery cell 2 is installed on the side surface 2h of the battery cell 2 and the signal process unit 32 and the controller side wireless unit 33 corresponding to the battery side control substrate 2d are installed at positions facing the side surface 2h of the battery cell 2 in the casing body 4, and the other configurations are the same as those of the first embodiment.

As shown in FIG. 15, in the battery pack 80 of the present embodiment, the controller side wireless unit 33 is installed on the inner side surface (the surface facing the battery cell 2) of the casing body 4 in the battery accommodation casing 3 so as to correspond to the arrangement of the battery cell 2. Further, the battery side control substrate 2d (including the battery side wireless unit 34), which is installed to the battery cell 2, is fixed to the side surface 2h of the battery cell 2 by general fixing means such as adhesive so as to correspond to the controller side wireless unit 33.

According to the third embodiment, in addition to the effect of the first embodiment, the coupling structure which enables the communication between the controller side wireless unit 33 and the BMU 50 can be simplified by installing the signal process unit 32 and the controller side wireless unit 33 in the casing body 4 accommodating the controller side control substrate 6 equipped with the BMU 50. Specifically, the coupling structure of the third connector 3c and the cover side connection terminal 5d of the first embodiment can be omitted. Further, as described below, when the generation of the battery side wireless signal Ssc is controlled by the control unit 102 by omitting the configuration of the connection sensor 3e, the battery pack 80 can be configured by omitting the cover portion 5, and the battery system 1 having an excellent maintenance workability can be obtained while the upper surface of the battery accommodation casing 3 is opened.

Fourth Embodiment

Figure 16:
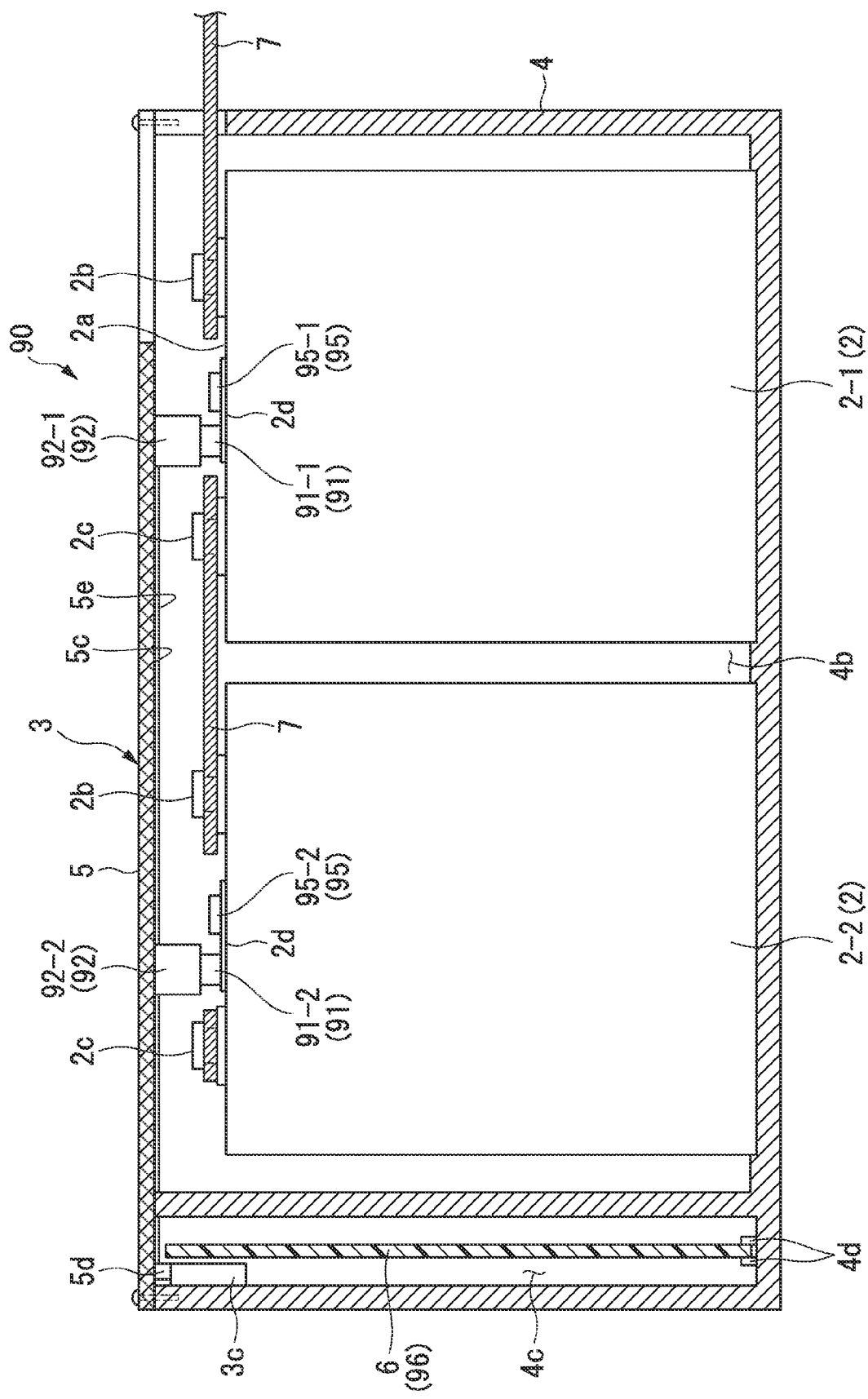
FIG. 16 is a cross-sectional view illustrating a battery pack which is included in a battery system of a fourth embodiment of the present invention.

Next, the fourth embodiment of the present invention will be described. FIG. 16 illustrates the fourth embodiment of the present invention.

The embodiment is different from the first embodiment in that the battery system 1 does not include the battery side wireless unit 34, the signal process unit 32, and the controller side wireless unit 33 and a CMU 95 and a BMU 96 communicate with each other by a connector, and the other configurations are the same as those of the first embodiment.

Specifically, as shown in FIG. 16, the battery pack 90 includes a battery side connector 91 which serves as a battery side communication unit installed on the battery side control substrate 2d of each battery cell 2 and a casing side connector 92 which serves as a controller side communication unit installed on the inner surface 5c of the cover portion 5 of the battery accommodation casing 3 so as to correspond to each battery side connector 91. Each battery side connector 91 is electrically connected to the corresponding CMU 95 on the battery side control substrate 2d. Further, the respective casing side connectors 92 (92-1, 92-2, 92-3, and 92-4) are sequentially connected in series to each other by the printed interconnection 5e, and each casing side connector 92 becomes a memory functional control connector capable of storing and adding the address information Da.

Even in this configuration, since each casing side connector 92 is configured to store the address information Da, the same effect as that of the first embodiment can be obtained.

Furthermore, according to the embodiment, since the CMU 95 and the BMU 96 communicate with each other by the connection without using a wireless unit, the battery system with a simpler configuration can be obtained.

While the embodiments and the modified examples of the invention have been described with reference to the drawings, the technical scope of the invention is not limited to the above-described embodiments, and may be modified into various forms without departing from the spirit of the invention.

For example, the control substrate accommodation portion 4c does not need to be installed to the battery accommodation casing 3, and the control substrate accommodation portion accommodating the controller side control substrate 6 may be installed inside the battery system 1 so as to be separate from the battery accommodation casing 3 unless the power feeding line H becomes too long. Accordingly, for example, the battery accommodation casing 3 may be separated from the battery system 1 while the electrical connection between the controller side control substrate 6 and the control unit 102 is maintained, allowing the assembly operation to be performed more efficiently.

In the above-described embodiment, the battery side wireless signal Ssc is generated by the trigger generated by the connection sensor 3e which detects the state where the cover portion 5 is attached to and detached from the casing body 4. However, instead of this configuration, the generation of the battery side wireless signal Ssc may be started at a predetermined timing by the control of the control unit 102.

In the above-described embodiment, the battery side wireless signal Ssc includes the CMU identification information and the battery information. However, the battery side wireless signal Ssc may include at least the battery status information Ds. Alternatively, the battery side information signal Ssc may be at least one of the battery status information Ds, the CMU identification information Ci, and the battery individual information Dp. In such a case, the controlling information table T1 is generated based on the information included in the battery side information signal Ssc.

INDUSTRIAL APPLICABILITY

The present invention relates to a battery system including: a plurality of battery cells; battery side control units which are respectively provided to the plurality of battery cells and electrically connected to the battery cells to generate a battery side information signal having battery information of the battery cells; a battery accommodation casing which accommodates the plurality of battery cells and at least the battery side control unit; battery side communication units, which are respectively provided to the battery side control units and transmit the battery side information signal; controller side communication units, which are installed to the battery accommodation casing, provided respectively to the battery side communication units, and add address information to the battery side information signal received from the battery side communication units to generate a synthesized battery side information signal; and controller side control units, which are electrically connected to the controller side communication units and generate controlling information corresponding to each battery cell inside the battery accommodation casing based on the battery information and the address information included in the synthesized battery side information signal received from the controller side communication units. According to the present invention, the battery cells can be controlled with a minimum burden of the operator, and at the same time, installation and replacement of the battery cells can be performed easily.

1: BATTERY SYSTEM
2: SECONDARY BATTERY (BATTERY CELL)
3: BATTERY ACCOMMODATION CASING
32: SIGNAL PROCESS UNIT (CONTROLLER SIDE COMMUNICATION UNIT)
33: CONTROLLER SIDE WIRELESS UNIT (CONTROLLER SIDE COMMUNICATION UNIT)
34: BATTERY SIDE WIRELESS UNIT (BATTERY SIDE COMMUNICATION UNIT)
40, 95: CMU (BATTERY SIDE CONTROL UNIT)
41: CONNECT INFORMATION RECEPTION UNIT
42: BATTERY SIDE MEMORY UNIT
43: BATTERY STATUS INFORMATION GENERATION UNIT
44: BATTERY SIDE WIRELESS SIGNAL GENERATION UNIT
50, 96: BMU (CONTROLLER SIDE CONTROL UNIT)
51: CONNECT INFORMATION GENERATION UNIT
52: CONTROLLER SIDE WIRELESS SIGNAL RECEPTION UNIT
53: TRUE-FALSE UNIT
54: CONTROLLER SIDE MEMORY UNIT
55: BATTERY STATUS MONITOR UNIT
56: CONTROLLING INFORMATION GENERATION UNIT
71: BATTERY BODY
72: CAP
87: MODULE
91: BATTERY SIDE CONNECTOR (BATTERY INFORMATION TRANSMISSION UNIT)
92: CASING SIDE CONNECTOR (BATTERY INFORMATION RECEPTION UNIT)
80, 90, 100: BATTERY PACK
102: CONTROL UNIT
103: INDICATOR UNIT

The invention claimed is:

1. A battery system comprising:
   a plurality of battery cells;
   battery side control units which are respectively provided to the plurality of battery cells and electrically connected to the battery cells to generate a battery side information signal having battery information of the battery cells;
   a battery accommodation casing which accommodates the plurality of battery cells and at least the battery side control unit;
   battery side communication units, which are respectively provided to the battery side control units and transmit the battery side information signal;
   controller side communication units, which are installed to the battery accommodation casing, provided respectively to the battery side communication units, and add address information to the battery side information signal received from the battery side communication units to generate a synthesized battery side information signal; and
   controller side control units, which are electrically connected to the controller side communication units and generate controlling information corresponding to each battery cell inside the battery accommodation casing based on the battery information and the address information included in the synthesized battery side information signal received from the controller side communication units.

2. The battery system according to claim 1, wherein the battery side communication units and the controller side communication units wirelessly communicate with each other.

3. The battery system according to claim 2, wherein the battery side information signal includes at least one of battery individual information used to identify the battery cell and battery side control unit identification information used to identify the battery side control unit, and the controller side control unit determines whether the battery cell is authentic based on the battery individual information when the battery individual information is included in the battery side information signal, and determines whether the battery side control unit is authentic based on the battery side control unit identification information when the battery side control unit identification information is included in the battery side information signal.

4. The battery system according to claim 3, wherein the battery cell comprises a battery body and a cap attachable to and detachable from the battery body, and at least the battery side signal transmission unit is installed to the cap.

5. The battery system according to claim 2, wherein the controller side communication unit is installed to the battery accommodation casing and provided respectively to the plurality of battery cells accommodated in the battery accommodation casing, and the address information added by each controller side communication unit corresponds to the accommodation position of the battery cell inside the battery accommodation casing.

* * * * *